(12) United States Patent
Yamada

(10) Patent No.: US 10,784,367 B2
(45) Date of Patent: Sep. 22, 2020

(54) SEMICONDUCTOR DEVICE AND SEMICONDUCTOR DEVICE MANUFACTURING METHOD

(71) Applicant: FUJITSU LIMITED, Kawasaki-shi, Kanagawa (JP)

(72) Inventor: Atsushi Yamada, Hiratsuka (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/163,624

(22) Filed: Oct. 18, 2018

(65) Prior Publication Data

US 2019/0157441 A1 May 23, 2019

(30) Foreign Application Priority Data

Nov. 22, 2017 (JP) ................. 2017-224997

(51) Int. Cl.
| | |
|---|---|
| H01L 29/778 | (2006.01) |
| H01L 29/66 | (2006.01) |
| H01L 21/02 | (2006.01) |
| H01L 29/207 | (2006.01) |
| H01L 29/43 | (2006.01) |
| H01L 29/20 | (2006.01) |
| H01L 29/08 | (2006.01) |
| H01L 29/417 | (2006.01) |

(52) U.S. Cl.
CPC ...... *H01L 29/7787* (2013.01); *H01L 21/0254* (2013.01); *H01L 21/0262* (2013.01); *H01L 21/02458* (2013.01); *H01L 21/02505* (2013.01); *H01L 29/207* (2013.01); *H01L 29/432* (2013.01); *H01L 29/66462* (2013.01); *H01L 29/7786* (2013.01); *H01L 29/0843* (2013.01); *H01L 29/2003* (2013.01); *H01L 29/41766* (2013.01)

(58) Field of Classification Search
CPC ......... H01L 29/66431; H01L 29/66462; H01L 29/778–7786; H01L 29/66242; H01L 29/66318; H01L 29/737; H01L 29/7787; H01L 29/7786; H01L 21/02505; H01L 29/432; H01L 29/207; H01L 21/0262; H01L 21/0254; H01L 21/02458; H01L 29/41766; H01L 29/0843; H01L 29/2003
See application file for complete search history.

(56) References Cited

U.S. PATENT DOCUMENTS 7,598,131 B1 * 10/2009 Micovic ............ H01L 21/28575
257/192
2014/0361308 A1   12/2014 Yui et al.
(Continued)

FOREIGN PATENT DOCUMENTS

JP   2014-239159 A   12/2014
JP   2017-011088 A    1/2017

*Primary Examiner* — Cuong B Nguyen
(74) *Attorney, Agent, or Firm* — Fujitsu Patent Center

(57) ABSTRACT

A semiconductor device includes a substrate, a channel layer containing GaN formed above the substrate, a barrier layer containing $In_{x1}Al_{y1}Ga_{1-x1-y1}N$ ($0.00 \leq x1 \leq 0.20$, $0.60 \leq y1 \leq 1.00$) formed above the channel layer, an intermediate layer containing $In_{x2}Al_{y2}Ga_{1-x2-y2}N$ ($0.00 \leq x2 \leq 0.04$, $0.30 \leq y2 \leq 0.60$) formed on the barrier layer, and a cap layer containing GaN formed on the intermediate layer.

11 Claims, 18 Drawing Sheets

(56) References Cited

U.S. PATENT DOCUMENTS

2015/0076508 A1* 3/2015 Saito ................... H01L 29/4236
                                                              257/76
2015/0332915 A1   11/2015 Yui et al.
2016/0372588 A1   12/2016 Mizuno

* cited by examiner

SEMICONDUCTOR DEVICE AND SEMICONDUCTOR DEVICE MANUFACTURING METHOD

CROSS-REFERENCE TO RELATED APPLICATION

This application is based on and claims priority to Japanese Patent Application No. 2017-224997, filed on Nov. 22, 2017, the entire contents of which are incorporated herein by reference.

FIELD

The embodiments discussed herein are related to a semiconductor device and a semiconductor device manufacturing method.

BACKGROUND

By utilizing advantages of a nitride semiconductor, such as high saturation velocity of an electron and a large bandgap, development of a high-voltage and high-power semiconductor device is actively conducted. With respect to a semiconductor device employing a nitride semiconductor, a large number of reports concerning a field-effect transistor, especially a high-electron-mobility transistor (HEMT), have been made. For example, in recent years, research on an InAlN-HEMT using InAlN as a barrier layer has become active. It is known that InAlN lattice-matches with GaN when a composition ratio of In is 17 to 18%. Also, if InAlN is formed in the above mentioned composition ratio, the InAlN has a high spontaneous polarization. Thus, in an InAlN-HEMT using InAlN as a barrier layer, higher concentration of two-dimensional electron gas (2DEG) can be generated, as compared to an AlGaN-HEMT using AlGaN as a barrier layer. Because of this reason, an InAlN-HEMT is attracting attention as a next-generation high-power device.

However, because a flatness of a surface of InAlN is not good, the InAlN-HEMT has a problem of having a large gate leakage current caused by an internal electric field of an InAlN layer. A comparison between a gate leakage current of an AlGaN-HEMT and a gate leakage current of an InAlN-HEMT is illustrated in FIG. 14. A dotted line A in FIG. 14 represents a gate leakage current of an AlGaN-HEMT, and a solid line B in FIG. 14 represents a gate leakage current of an InAlN-HEMT. As illustrated in FIG. 14, the gate leakage current of the InAlN-HEMT is larger than the gate leakage current of an AlGaN-HEMT.

A technique for forming a GaN layer on an InAlN layer is known (see Patent Document 1, for example). Because a flatness of a surface improves by forming a GaN layer on an InAlN layer, a gate leakage current of an InAlN-HEMT is reduced. FIG. 15 is a graph illustrating a gate leakage characteristic of an InAlN-HEMT not having a GaN layer formed on an InAlN layer and a gate leakage characteristic of an InAlN-HEMT having a GaN layer formed on an InAlN layer. In the InAlN-HEMTs, an AlN spacer layer is formed on a GaN channel layer, and an InAlN layer is formed on the AlN spacer layer. A solid line C in FIG. 15 represents a gate leakage current of an InAlN-HEMT not having a GaN layer on the InAlN layer, and a solid line D in FIG. 15 represents a gate leakage current of an InAlN-HEMT having a GaN layer on the InAlN layer. As illustrated in FIG. 15, by the GaN layer being formed on the InAlN layer, a gate leakage current of the InAlN-HEMT decreases.

However, In and Al are incorporated into the GaN layer from the InAlN layer under the GaN layer, and the In and Al cause a problem that an electric characteristic of the InAlN-HEMT degrades. FIG. 16 is a graph illustrating current-voltage characteristics of an InAlN-HEMT not having a GaN layer formed on an InAlN layer. FIG. 17 is a graph illustrating current-voltage characteristics of an InAlN-HEMT having a GaN layer formed on an InAlN layer. As illustrated in FIG. 17, by the GaN layer being formed on the InAlN layer, pinch-off characteristics degrade. To solve the problem, a technique is known, in which an InAlGaN layer having a low composition of Al and In is formed between an InAlN layer and a GaN layer (see Patent Document 2, for example). However, if an InAlGaN layer having a low composition of Al and In is formed between an InAlN layer and a GaN layer, a problem occurs in which spontaneous polarization decreases and sheet resistance increases.

The following are reference documents:
[Patent Document 1] Japanese Laid-Open Patent Publication No. 2017-11088
[Patent Document 2] Japanese Laid-Open Patent Publication No. 2014-239159

SUMMARY

According to an aspect of the embodiments, a semiconductor device includes a substrate, a channel layer containing GaN formed above the substrate, a barrier layer containing $In_{x1}Al_{y1}Ga_{1-x1-y1}N$ ($0.00 \leq x1 \leq 0.20$, $0.60 \leq y1 \leq 1.00$) formed above the channel layer, an intermediate layer containing $In_{x2}Al_{y2}Ga_{1-x2-y2}N$ ($0.00 \leq x2 < 0.04$, $0.30 \leq y2 \leq 0.60$) formed on the barrier layer, and a cap layer containing GaN formed on the intermediate layer.

The object and advantages of the invention will be realized and attained by means of the elements and combinations particularly pointed out in the claims. It is to be understood that both the foregoing general description and the following detailed description are exemplary and explanatory and are not restrictive of the invention.

DESCRIPTION OF EMBODIMENTS

In the following, semiconductor devices and methods of manufacturing the semiconductor devices according to embodiments of the present disclosure will be described with reference to drawings. Structures of the semiconductor devices and processes of the method, which will be described below, are merely examples. That is, the present invention is not limited to the semiconductor devices according to the following embodiments or not limited to the methods of manufacturing the semiconductor devices according to the following embodiments.

Reference Example

Figure 18:
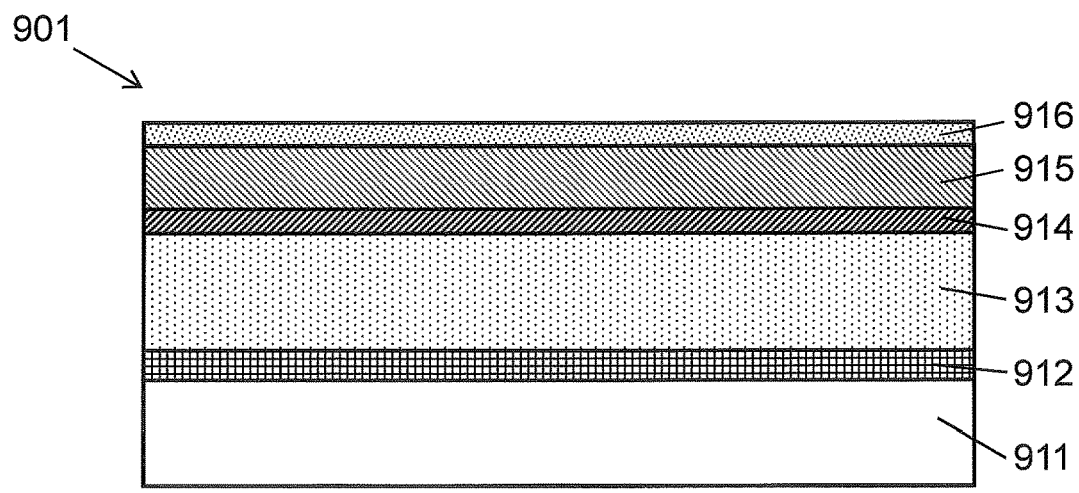
FIG. 18 is a cross-sectional view illustrating a structure of a semiconductor device according to a reference example.

First, a reference example will be explained. FIG. 18 is a cross-sectional view illustrating a structure of a semiconductor device 901 according to the reference example. The semiconductor device 901 is a semiconductor device of a HEMT structure. The semiconductor device 901 includes a substrate 911, an AlN nucleation layer 912, a GaN channel layer 913, an AlGaN spacer layer 914, an InAlN barrier layer 915, and a GaN cap layer 916. The InAlN barrier layer 915 is formed of material containing $In_{0.15}Al_{0.85}N$. On the substrate 911, the AlN nucleation layer 912, the GaN channel layer 913, the AlGaN spacer layer 914, the InAlN barrier layer 915, and the GaN cap layer 916 are sequentially layered.

Figure 19:
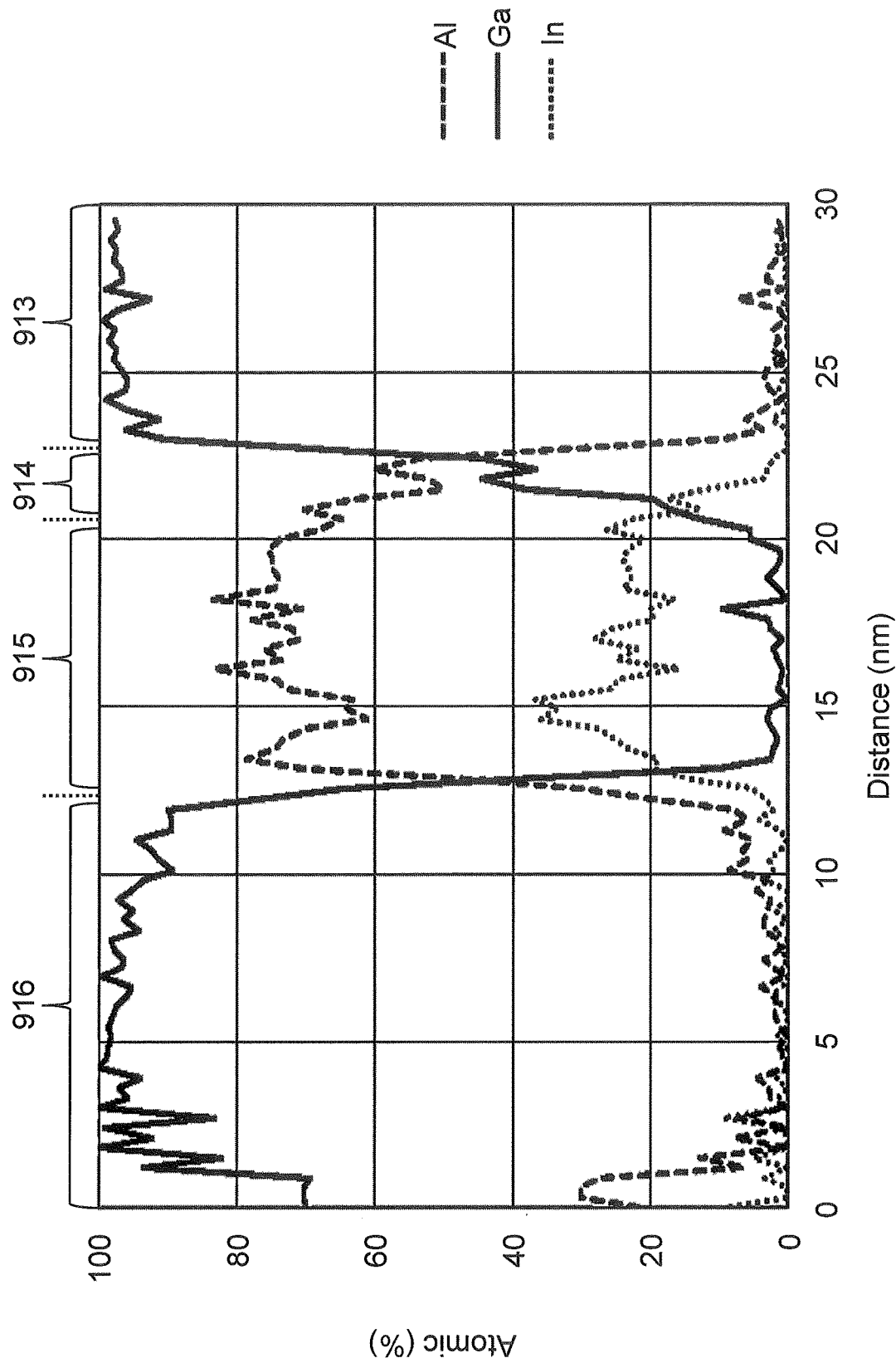
FIG. 19 is a distribution chart illustrating composition of Al, Ga, and In in the semiconductor device according to the reference example.

FIG. 19 is a distribution chart illustrating composition of Al, Ga, and In with respect to the GaN channel layer 913, the AlGaN spacer layer 914, the InAlN barrier layer 915, and the GaN cap layer 916 in the semiconductor device 901 according to the reference example. Because In and Al are incorporated into the GaN cap layer 916 from the InAlN barrier layer 915, respective composition ratios of In and Al in the GaN cap layer 916 are high in a vicinity of an interface of the InAlN barrier layer 915 and the GaN cap layer 916, as illustrated in FIG. 19. The vicinity of the interface of the InAlN barrier layer 915 and the GaN cap layer 916 in the GaN cap layer 916 means, for example, a region of the GaN cap layer 916 within 3 nm from the interface of the InAlN barrier layer 915 and the GaN cap layer 916. If In and Al are incorporated into the GaN cap layer 916 from InAlN barrier layer 915, an electric characteristic of the InAlN-HEMT degrades. As illustrated in FIG. 19, at positions above 3 nm in the GaN cap layer 916 from the interface of the InAlN barrier layer 915 and the GaN cap layer 916, respective composition ratios of In and Al are low. Thus, in a case in which a thickness of the GaN cap layer 916 is more than 3 nm, effect of incorporation of In and Al is alleviated. However, if a thickness of the GaN cap layer 916 is more than 3 nm, high-frequency characteristics of the semiconductor device 901 may degrade.

First Embodiment

Figure 1:
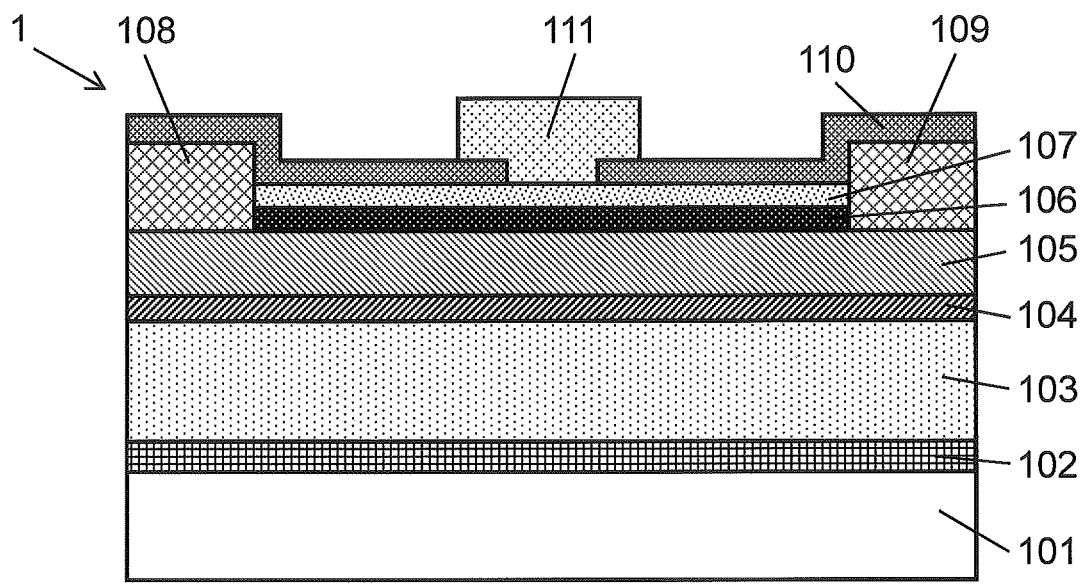
FIG. 1 is a cross-sectional view illustrating a structure of a semiconductor device according to a first embodiment.

Next, a first embodiment will be described. FIG. 1 is a cross-sectional view illustrating a structure of a semiconductor device 1 according to the first embodiment. The semiconductor device 1 according to the first embodiment is a semiconductor device of a HEMT structure. The semiconductor device 1 includes a substrate 101, a nucleation layer 102, a channel layer 103, a spacer layer 104, a barrier layer 105, an intermediate layer 106, and a cap layer 107. The substrate 101 is a semi-insulating SiC substrate, for example. The nucleation layer 102 includes AlN. The channel layer 103 includes GaN. The barrier layer 105 includes $In_{x1}Al_{y1}Ga_{1-x1-y1}N$ ($0.00 \leq x1 \leq 0.20$, $0.60 \leq y1 \leq 1.00$). The intermediate layer 106 includes $In_{x2}Al_{y2}Ga_{1-x2-y2}N$ ($0.00 \leq x2 \leq 0.04$, $0.30 \leq y2 \leq 0.60$). Composition of the barrier layer 105 and the intermediate layer 106 may be the same. The spacer layer 104 includes $Al_{x3}Ga_{1-x3}N$ ($0.30 \leq x3 \leq 1.00$). The cap layer 107 includes GaN. On the substrate 101, the nucleation layer 102, the channel layer 103, the spacer layer 104, the barrier layer 105, the intermediate layer 106, and the cap layer 107 are sequentially layered. By inserting the intermediate layer 106 containing $In_{x2}Al_{y2}Ga_{1-x2-y2}N$ ($0.00 \leq x2 < 0.04$, $0.30 \leq y2 \leq 0.60$) between the barrier layer 105 and the cap layer 107, incorporation of In and Al into the cap layer 107 is suppressed, and increase of sheet resistance in the semiconductor device 1 can be suppressed.

The semiconductor device 1 includes a source electrode 108, a drain electrode 109, passivation film 110, and a gate electrode 111. The source electrode 108 and the drain electrode 109 are formed on the barrier layer 105. The gate electrode 111 is formed on the cap layer 107. The passivation film 110 covers a part of the cap layer 107, and also covers the source electrode 108 and the drain electrode 109. When the semiconductor device 1 operates, 2DEG is generated in the channel layer 103, near an interface between the channel layer 103 and the spacer layer 104.

Figure 2:
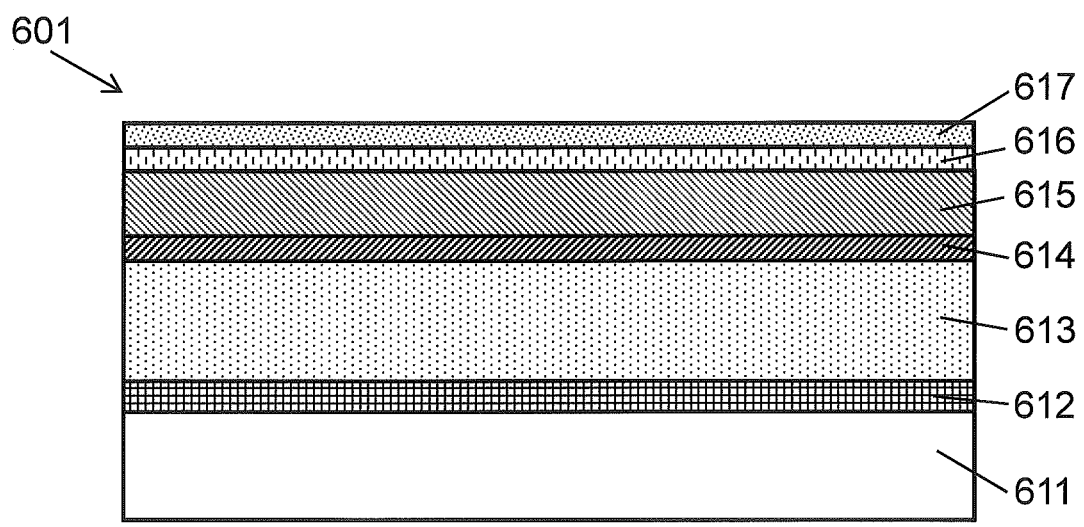
FIG. 2 is a cross-sectional view illustrating a structure of a semiconductor device according to a first comparative example.

FIG. 2 is a cross-sectional view illustrating a structure of a semiconductor device 601 according to a first comparative example. The semiconductor device 601 is a semiconductor device of a HEMT structure. The semiconductor device 601 includes a substrate 611, an AlN nucleation layer 612, a GaN channel layer 613, an AlGaN spacer layer 614, an InAlN barrier layer 615, an InAlN intermediate layer 616, and a GaN cap layer 617. On the substrate 611, the AlN nucleation layer 612, the GaN channel layer 613, the AlGaN spacer layer 614, the InAlN barrier layer 615, the InAlN intermediate layer 616, and the GaN cap layer 617 are sequentially layered. The InAlN intermediate layer 616 is formed of material containing $In_{0.04}Al_{0.96}N$.

Figure 3:
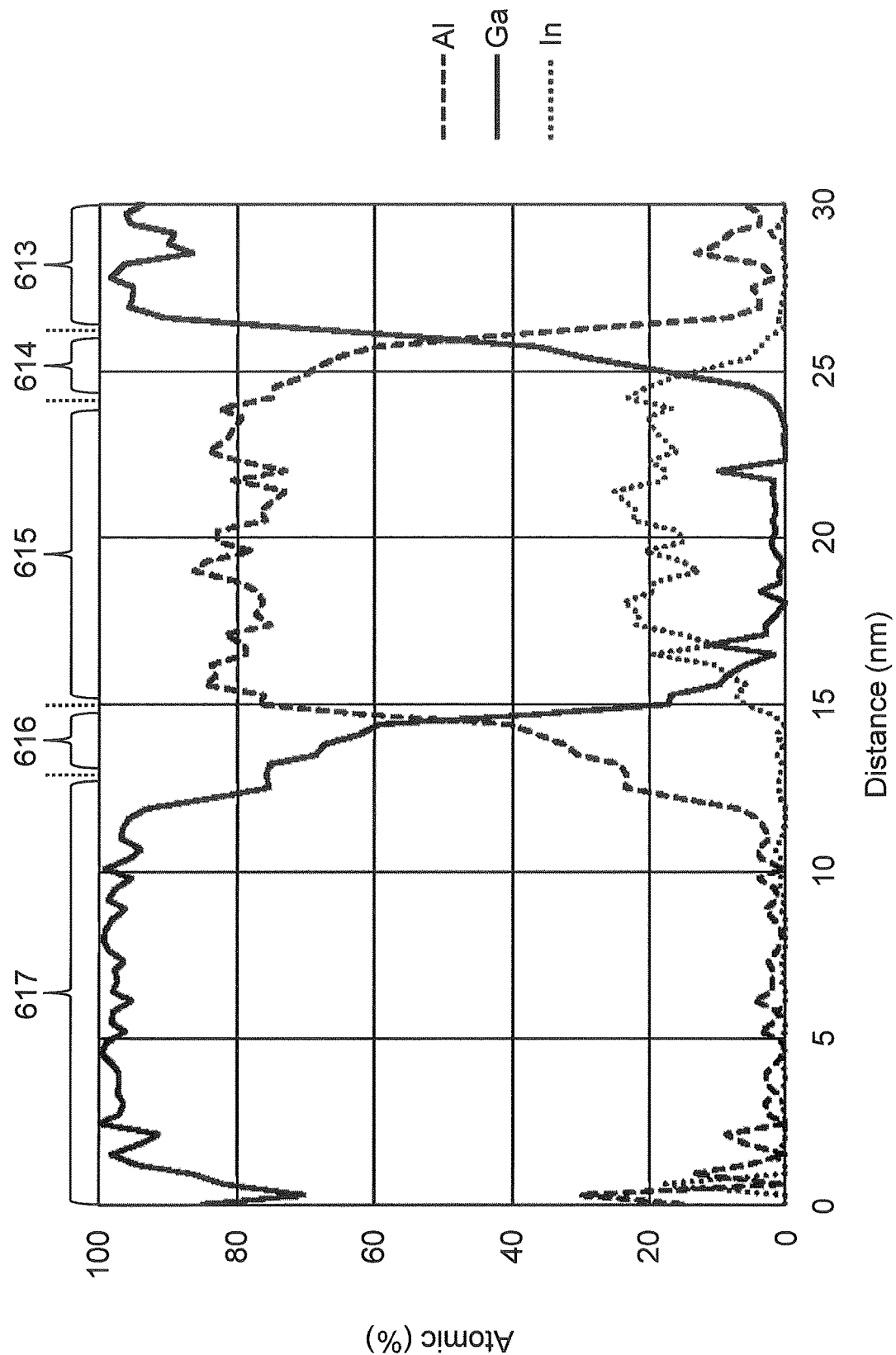
FIG. 3 is a distribution chart illustrating composition of Al, Ga, and In in the semiconductor device according to the first comparative example.

FIG. 3 is a distribution chart illustrating composition of Al, Ga, and In with respect to the GaN channel layer 613, the AlGaN spacer layer 614, the InAlN barrier layer 615, the InAlN intermediate layer 616, and the GaN cap layer 617 in the semiconductor device 601 according to the first comparative example. By inserting the InAlN intermediate layer 616 containing $In_{0.04}Al_{0.96}N$ between the InAlN barrier layer 615 and the GaN cap layer 617, incorporation of In from the InAlN barrier layer 615 into the GaN cap layer 617 is suppressed, as illustrated in FIG. 3. Accordingly, with respect to the InAlN intermediate layer 616, by adjusting a composition rate of In to be 0.04 or less, incorporation of In into the GaN cap layer 617 can be suppressed. Based on the result illustrated in FIG. 3, with respect to the intermediate layer 106 of the semiconductor device 1, by adjusting a composition rate of In to be 0.04 or less, incorporation of In into the cap layer 107 can be suppressed. If incorporation of In into the cap layer 107 is suppressed, degradation of an electric characteristic of the semiconductor device 1 is avoided, and reliability of the semiconductor device 1 improves. However, as illustrated in FIG. 3, because a composition rate of Al is high in the InAlN intermediate layer 616, incorporation of Al from the InAlN intermediate layer 616 into the GaN cap layer 617 becomes larger.

Figure 4:
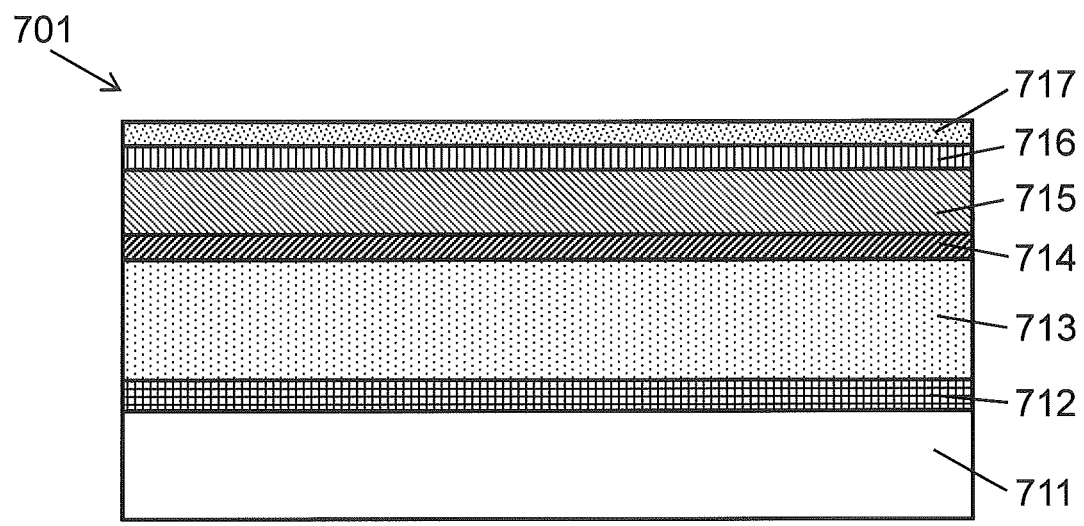
FIG. 4 is a cross-sectional view illustrating a structure of a semiconductor device according to a second comparative example.

FIG. 4 is a cross-sectional view illustrating a structure of a semiconductor device 701 according to a second comparative example. The semiconductor device 701 according to the second comparative example is a semiconductor device of a HEMT structure. The semiconductor device 701 includes a substrate 711, an AlN nucleation layer 712, a GaN channel layer 713, an AlGaN spacer layer 714, an InAlN barrier layer 715, an AlGaN intermediate layer 716, and a GaN cap layer 717. On the substrate 711, the AlN nucleation layer 712, the GaN channel layer 713, the AlGaN spacer layer 714, the InAlN barrier layer 715, the AlGaN intermediate layer 716, and the GaN cap layer 717 are sequentially layered. The AlGaN intermediate layer 716 is formed of material containing $Al_{0.60}Ga_{0.40}N$.

Figure 5:
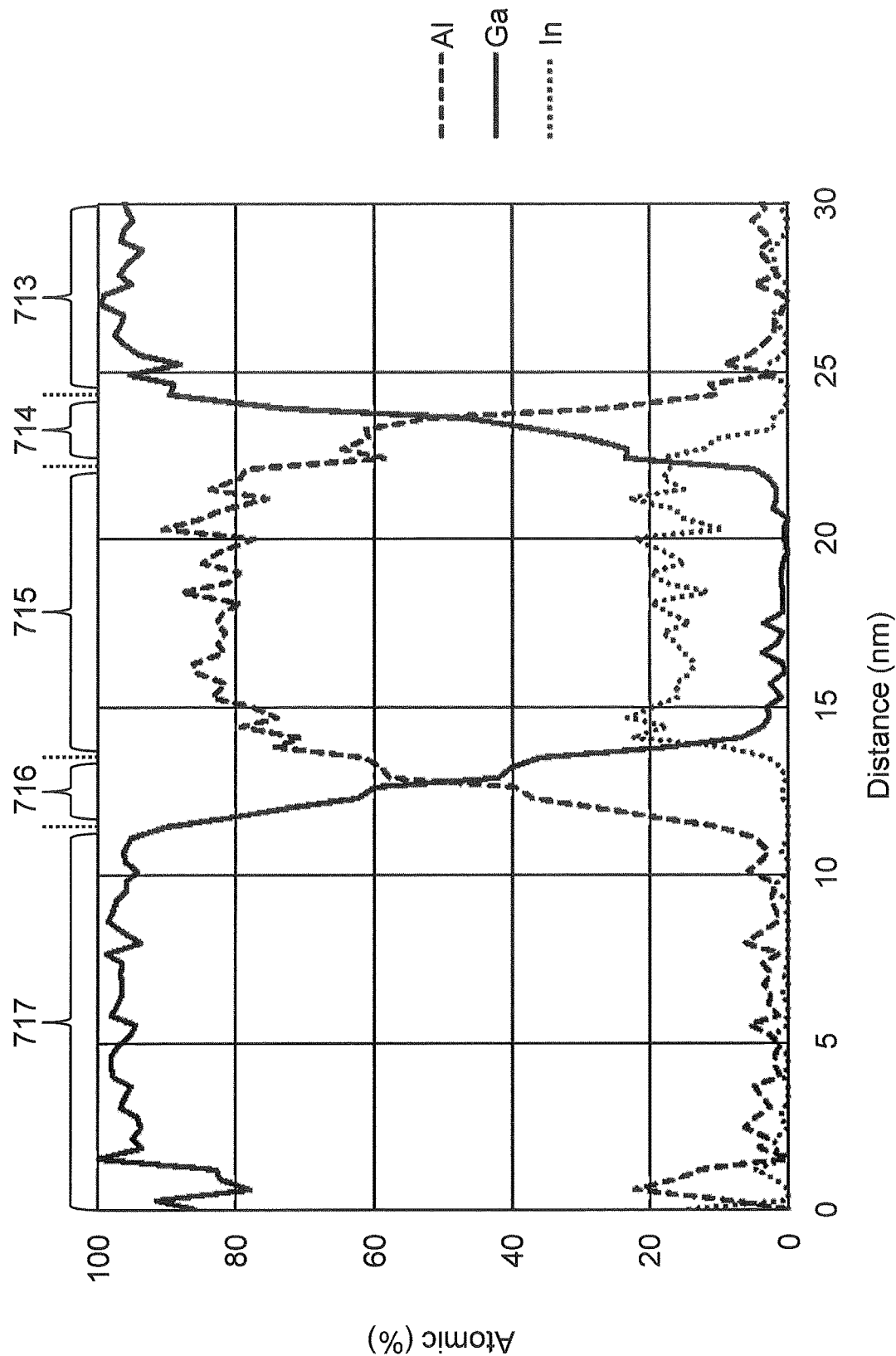
FIG. 5 is a distribution chart illustrating composition of Al, Ga, and In in the semiconductor device according to the second comparative example.

FIG. 5 is a distribution chart illustrating composition of Al, Ga, and In with respect to the GaN channel layer 713, the AlGaN spacer layer 714, the InAlN barrier layer 715, the AlGaN intermediate layer 716, and the GaN cap layer 717 in the semiconductor device 701 according to the second comparative example. By inserting the AlGaN intermediate layer 716 containing $Al_{0.60}Ga_{0.40}N$ between the InAlN barrier layer 715 and the GaN cap layer 717, incorporation of Al from the InAlN barrier layer 715 into the GaN cap layer 717 is suppressed, as illustrated in FIG. 5. Accordingly, with respect to the AlGaN intermediate layer 716, by adjusting a composition rate of Al to be 0.60 or less, incorporation of Al into the GaN cap layer 717 can be suppressed. Based on the result illustrated in FIG. 5, with respect to the intermediate layer 106 of the semiconductor device 1, by adjusting a composition rate of Al to be 0.60 or less, incorporation of Al into the cap layer 107 can be suppressed. If incorporation of Al into the cap layer 107 is suppressed, degradation of an electric characteristic of the semiconductor device 1 is avoided, and reliability of the semiconductor device 1 improves.

Figure 6:
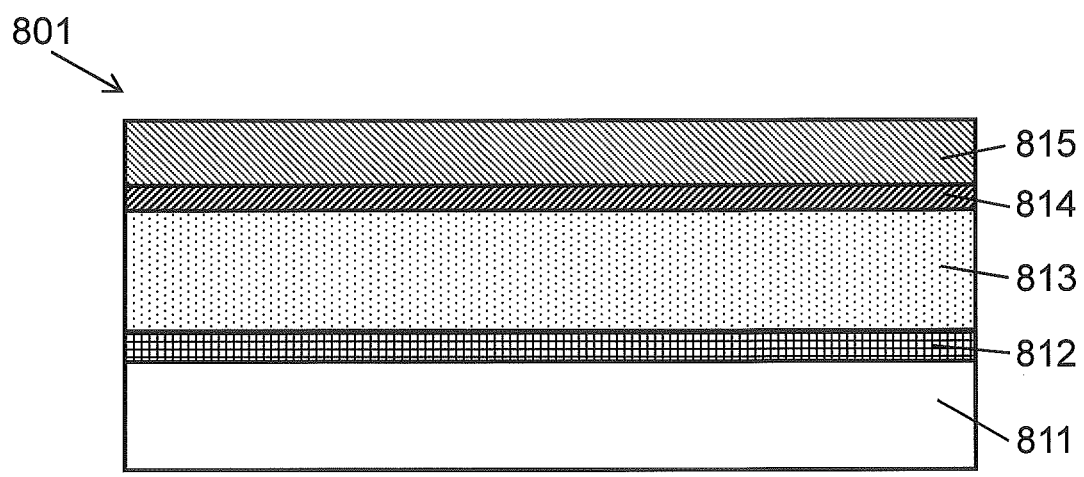
FIG. 6 is a cross-sectional view illustrating a structure of a semiconductor device according to a third comparative example.

FIG. 6 is a cross-sectional view illustrating a structure of a semiconductor device 801 according to a third comparative example. The semiconductor device 801 according to the third comparative example is a semiconductor device of a HEMT structure. The semiconductor device 801 includes a substrate 811, an AlN nucleation layer 812, a GaN channel layer 813, an AlGaN spacer layer 814, and an InAlGaN barrier layer 815. On the substrate 811, the AlN nucleation layer 812, the GaN channel layer 813, the AlGaN spacer layer 814, and the InAlGaN barrier layer 815 are sequentially layered. The InAlGaN barrier layer 815 is formed of material containing $In_{0.05}Al_xGa_{0.95-x}N$.

Figure 7:
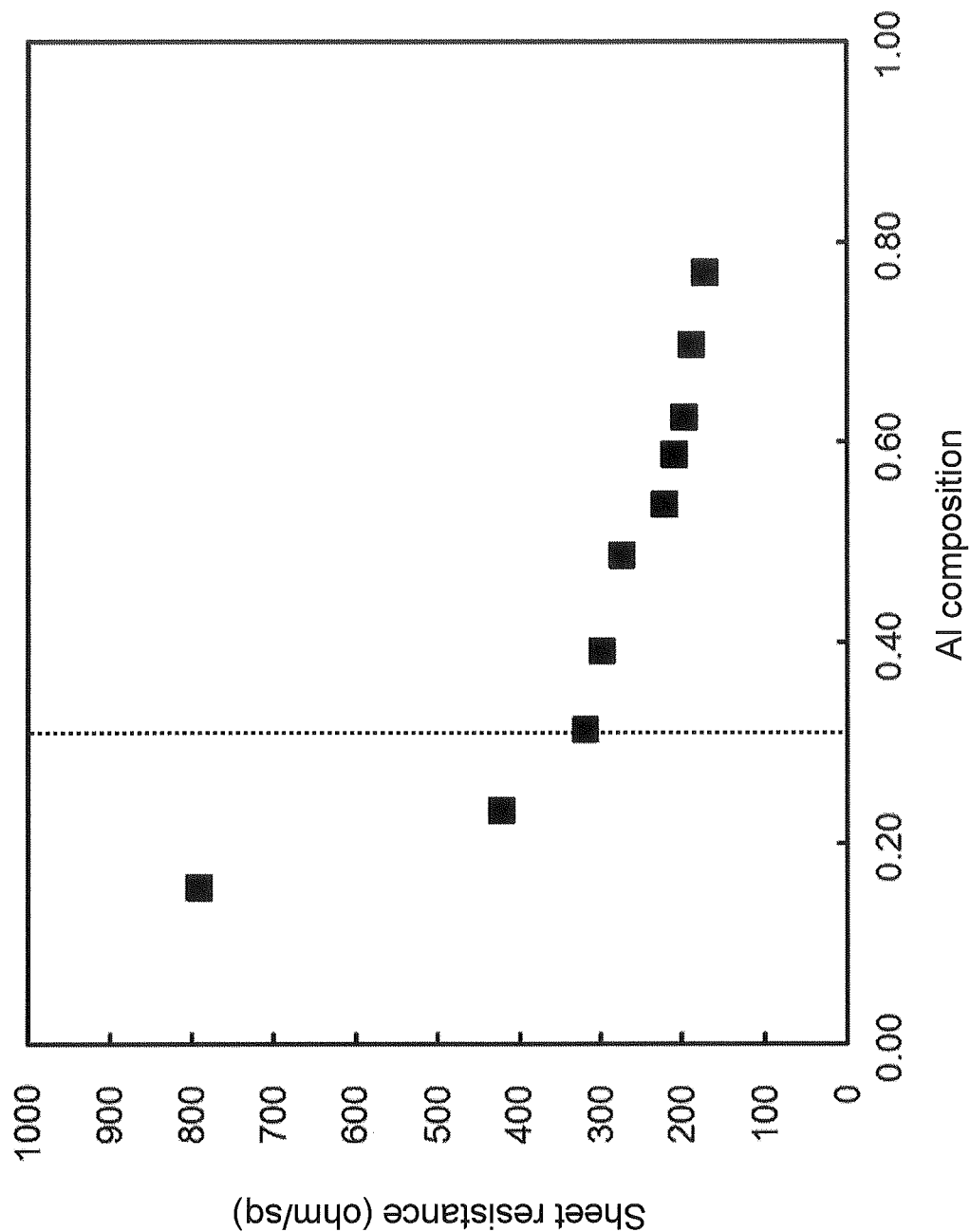
FIG. 7 is a graph illustrating dependence on Al composition, with respect to sheet resistance of the semiconductor device according to the third comparative example.

FIG. 7 is a graph illustrating dependence on Al composition, with respect to sheet resistance of the semiconductor device 801 according to the third comparative example. A horizontal axis in FIG. 7 represents an Al composition ratio of the InAlGaN barrier layer 815, and a vertical axis in FIG. 7 represents sheet resistance (ohm/square) of the semiconductor device 801. As illustrated in FIG. 7, in a case in which an Al composition ratio of the InAlGaN barrier layer 815 becomes less than 0.3, sheet resistance of the semiconductor device 801 largely increases. Accordingly, with respect to the InAlGaN barrier layer 815 of the semiconductor device 801, by adjusting a composition rate of Al to be 0.30 or more, increase of sheet resistance of the semiconductor device 801 can be suppressed. Based on the result illustrated in FIG. 7, with respect to the intermediate layer 106 of the semiconductor device 1, by adjusting a composition rate of Al to be 0.30 or more, increase of sheet resistance of the semiconductor device 1 can be suppressed. Similarly, by adjusting an Al composition rate of the spacer layer 104 in the semiconductor device 1 to be 0.30 or more, increase of sheet resistance of the semiconductor device 1 can be suppressed.

According to the results illustrated in FIGS. 3, 5, and 7, it is found that incorporation of In and Al and increase of sheet resistance can be suppressed by inserting the intermediate layer 106 containing $In_{x2}Al_{y2}Ga_{1-x2-y2}N$ ($0.00 \leq x2 < 0.04$, $0.30 \leq y2 \leq 0.60$) between the barrier layer 105 and the cap layer 107 of the semiconductor device 1.

Manufacturing Method of the Semiconductor Device

Figure 8A:
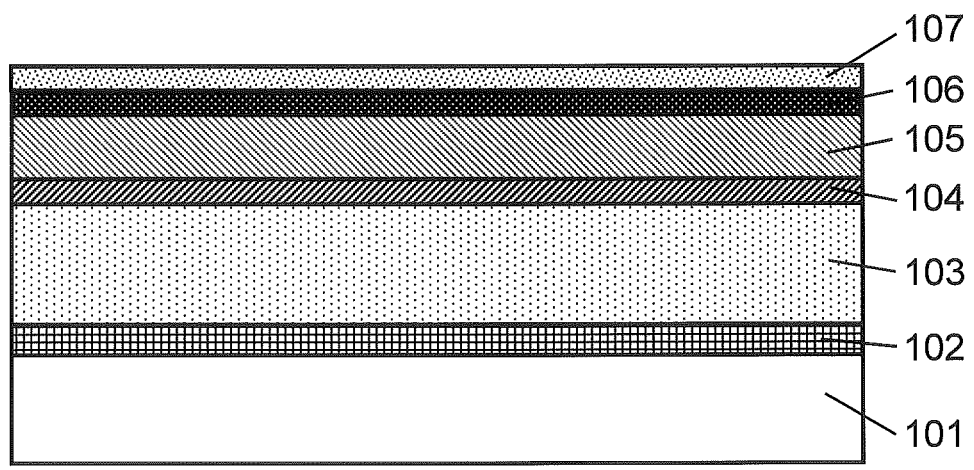
FIGS. 8A to 8F are cross-sectional views illustrating a manufacturing process of the semiconductor device according to the first embodiment.

A method of manufacturing the semiconductor device 1 according to the first embodiment will be described with reference to FIGS. 8A to 8F. FIGS. 8A to 8F are cross-sectional views illustrating a manufacturing process of the semiconductor device 1 according to the first embodiment. First, as illustrated in FIG. 8A, the substrate 101 is prepared. The substrate 101 is a semi-insulating SiC substrate. Next, as illustrated in FIG. 8A, the nucleation layer 102, the channel layer 103, the spacer layer 104, the barrier layer 105, the intermediate layer 106, and the cap layer 107 are sequentially layered on the substrate 101, by using MOVPE (Metal Organic Vapor Phase Epitaxy) method. Specifically, the nucleation layer 102 is formed on the substrate 101, the channel layer 103 is formed on the nucleation layer 102, and the spacer layer 104 is formed on the channel layer 103. Further, the barrier layer 105 is formed on the spacer layer 104, the intermediate layer 106 is formed on the barrier layer 105, and the cap layer 107 is formed on the intermediate layer 106.

The nucleation layer 102 includes AlN. A thickness of the nucleation layer 102 is, for example, approximately 100 nm. The channel layer 103 includes GaN. A thickness of the channel layer 103 is, for example, approximately 3 μm. The spacer layer 104 includes $Al_{x3}Ga_{1-x3}N$ ($0.30 \leq x3 \leq 1.00$). A thickness of the spacer layer 104 is, for example, approximately 2 nm. In a case in which a thickness of the spacer layer 104 is more than 2 nm and the semiconductor device 1 becomes thicker, high-frequency characteristics of the semiconductor device 1 may degrade. Further, in the case in which the thickness of the spacer layer 104 is more than 2 nm, distortion of the spacer layer 104 becomes large and cracks may be generated on the spacer layer 104. Thus, the thickness of the spacer layer 104 may preferably be not more than 2 nm.

The barrier layer 105 includes $In_{x1}Al_{y1}Ga_{1-x1-y1}N$ ($0.00 \le x1 \le 0.20$, $0.60 \le y1 \le 1.00$). A thickness of the barrier layer 105 is, for example, approximately 10 nm. The intermediate layer 106 includes $In_{x2}Al_{y2}Ga_{1-x2-y2}N$ ($0.00 \le x2 < 0.04$, $0.30 \le y2 \le 0.60$). A thickness of the intermediate layer 106 is, for example, approximately 2 nm. The cap layer 107 includes GaN. A thickness of the cap layer 107 is, for example, approximately 2 nm. As described above with reference to FIG. 18, in a case in which a thickness of the cap layer 107 is more than 3 nm, high-frequency characteristics of the semiconductor device 1 may degrade. Thus, it is preferable that a thickness of the cap layer 107 is not more than 3 nm. If a thickness of the cap layer 107 is not more than 3 nm, incorporation of In and Al into the cap layer 107 can be suppressed and increase of sheet resistance of the semiconductor device 1 can be suppressed, without degrading high-frequency characteristics of the semiconductor device 1.

In order to grow GaN, mixed gas of trimethylgallium (TMGa) gas (which is a source of Ga) and ammonia ($NH_3$) gas is used as a source gas. In order to grow AlN, mixed gas of trimethylaluminium (TMAl) gas (which is a source of Al) and $NH_3$ gas is used as a source gas. In order to grow InAlGaN, mixed gas of trimethylindium (TMIn) gas, TMAl gas, TMGa gas, and $NH_3$ gas is used as a source gas. In accordance with a type of a compound semiconductor to be grown, supplying status of TMIn gas, TMAl gas, and TMGa gas (such as necessity or a flow rate of these gases) may be appropriately controlled. Further, a growth pressure of each of the compound semiconductors is approximately 1 kPa to 100 kPa, and a growth temperature of each of the compound semiconductors is approximately 700° C. to 1200° C.

Next, by using photolithography, a photoresist for isolation is formed. The photoresist for isolation includes an opening at a location where an isolation region is to be formed. Subsequently, dry etching using chlorine-based gas or ion implantation is performed using the photoresist for isolation as a mask, to form an isolation region (not illustrated).

Figure 8B:
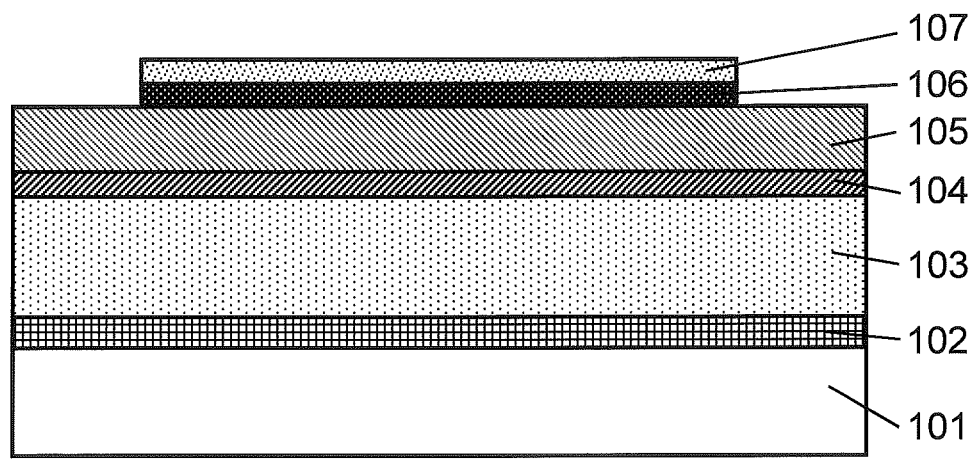

After the photoresist for isolation is removed, by using photolithography, a photoresist for source and drain electrodes is formed. The photoresist for source and drain electrodes includes openings at regions where the source electrode 108 and the drain electrode 109 are to be formed (in the following, the regions where the source electrode 108 and the drain electrode 109 are to be formed may also be referred to as "planned regions for source/drain electrodes"). Next, as illustrated in FIG. 8B, dry etching using chloride based gas is performed using the photoresist for source and drain electrodes as a mask, in order to remove parts of the cap layer 107 and the intermediate layer 106 corresponding to the planned regions for source/drain electrodes. Note that an illustration of the photoresist for source and drain electrodes is omitted in FIG. 8B.

Figure 8C:
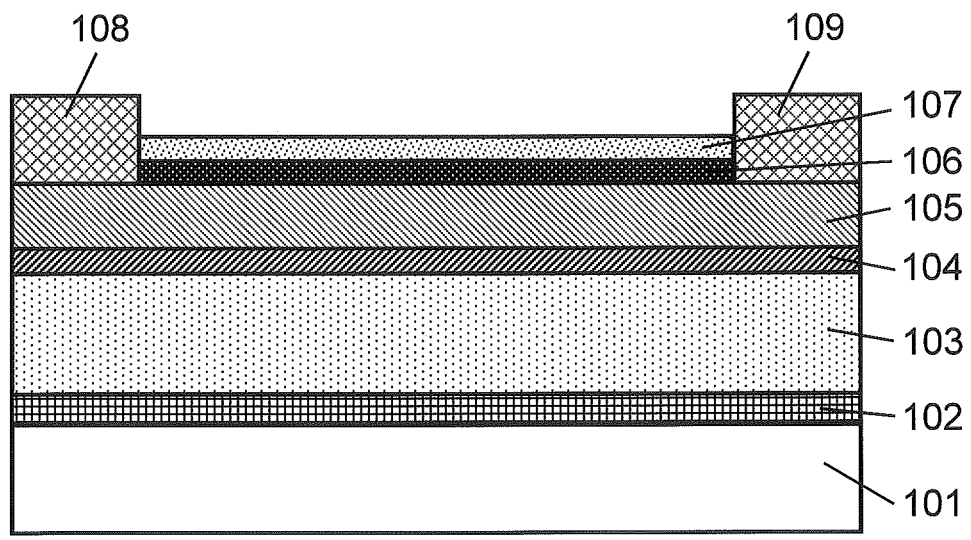

After the photoresist for source and drain electrodes is removed, by using techniques of photolithography, vapor deposition, and liftoff, Ta and Al are sequentially formed on the planned regions for source/drain electrodes. A thickness of Ta is, for example, approximately 20 nm. A thickness of Al is, for example, approximately 200 nm. Subsequently, the substrate 101 is heat-treated in a nitrogen atmosphere at a temperature of approximately 400° C. to 1000° C. for example, at 550° C., to establish an ohmic characteristic. By forming Ta and Al as described above, the source electrode 108 and the drain electrode 109 are formed on the barrier layer 105, as illustrated in FIG. 8C. The source electrode 108 and the drain electrode 109 are of layered structures, in which Al is disposed at an upper layer and Ta is disposed at a lower layer.

Figure 8D:
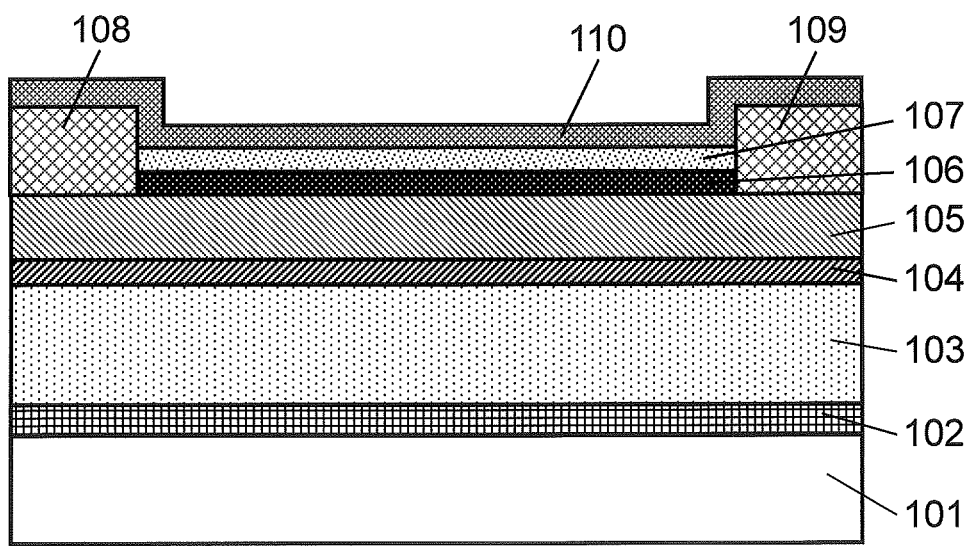

Next, by using the plasma-enhanced chemical vapor deposition (CVD) method, the passivation film 110 is formed so as to cover the cap layer 107, the source electrode 108, and the drain electrode 109, as illustrated in FIG. 8D. A thickness of the passivation film 110 is approximately 2 nm to 500 nm, and approximately 100 nm for example. The passivation film 110 may be formed by either ALD (Atomic Layer Deposition) or sputter deposition. Further, it is preferable that material for forming the passivation film 110 is oxide, nitride, or oxynitride of Si, Al, Hf, Zr, Ti, Ta, or W. For example, SiN is more preferable.

Figure 8E:
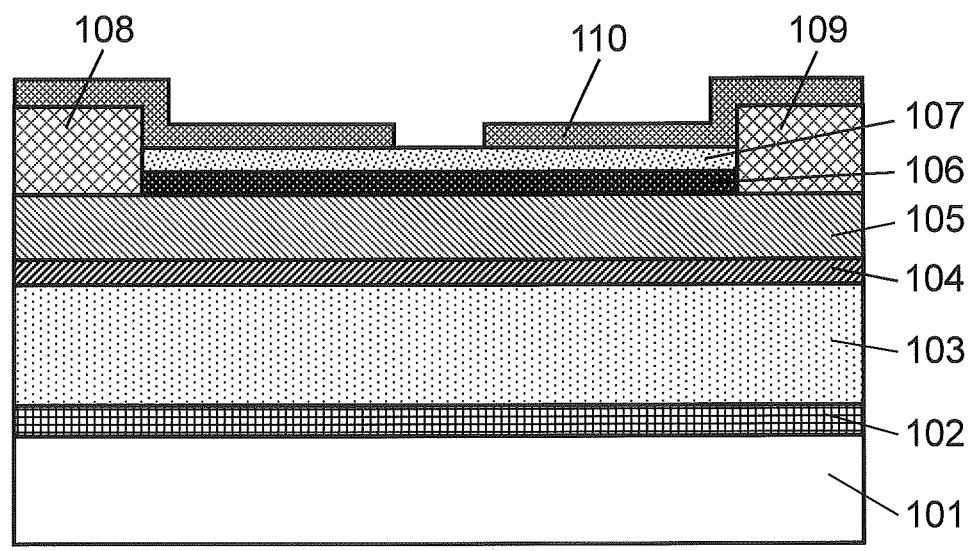

Next, by using photolithography, a photoresist for a gate electrode is formed. The photoresist for a gate electrode includes an opening at a location corresponding to a part of an area on which the gate electrode 111 is to be formed (in the following, the area on which the gate electrode 111 is to be formed may also be referred to as a "planned area for gate electrode"). As illustrated in FIG. 8E, dry etching using fluorine-based gas or chlorine-based gas is performed using the photoresist for gate electrode as a mask, in order to remove a part of the passivation film 110 corresponding to the opening of the photoresist for gate electrode. Note that an illustration of the photoresist for gate electrode is omitted in FIG. 8E. Alternatively, the part of the passivation film 110 corresponding to the opening of the photoresist for gate electrode may be removed by wet etching using hydrofluoric acid or buffered hydrofluoric acid.

Figure 8F:
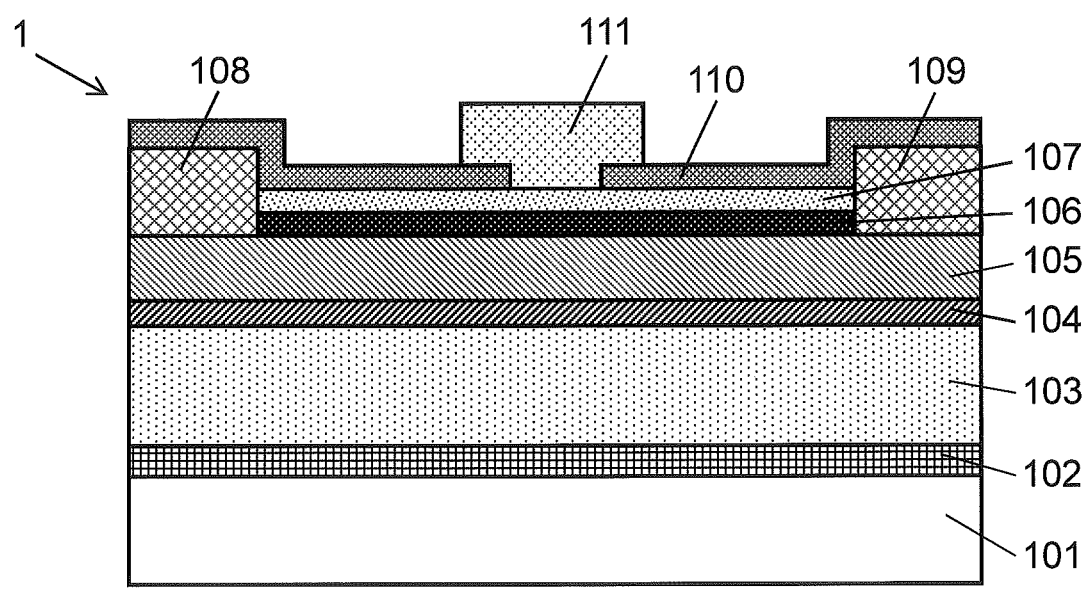

After the photoresist for gate electrode is removed, by using techniques of photolithography, vapor deposition, and liftoff, Ni and Au are sequentially formed on the planned area for gate electrode. A thickness of Ni is, for example, approximately 30 nm. A thickness of Au is, for example, approximately 400 nm. By forming Ni and Au as described above, the gate electrode 111 is formed on the cap layer 107, as illustrated in FIG. 8F. The gate electrode 111 is of a layered structure, in which Au is located at an upper layer and Ni is located at a lower layer. By performing the above processes, the semiconductor device 1 illustrated in FIG. 8F is manufactured.

The above mentioned layered structures of the source electrode 108, the drain electrode 109, and the gate electrode 111, in the semiconductor device 1 according to the first embodiment, are merely an example. That is, other types of structures (regardless of a single layered structure or a multi layered structure) may be employed in the source electrode 108, the drain electrode 109, and the gate electrode 111. Also, the above mentioned method of forming the source electrode 108, the drain electrode 109, and the gate electrode 111 are merely an example. That is, the source electrode 108, the drain electrode 109, and the gate electrode 111 may be formed by using other methods. In the manufacturing method of the semiconductor device 1 according to the first embodiment described above, heat treatment is performed when the source electrode 108 and the drain electrode 109 are formed. However, if an ohmic characteristic can be established without heat treatment, the heat treatment may be omitted. Further, heat treatment may further be applied to the gate electrode 111.

In the semiconductor device 1 according to the first embodiment, an SiC substrate of a semi-insulating substrate is used as the substrate 101. However, other material may be used as a substrate, if a nitride semiconductor is used in a part of an epitaxial structure having a function of a field effect transistor. Further, the substrate 101 may be a semi-insulating member or a conductive member. For example, a conductive SiC substrate, a sapphire substrate, a GaN substrate, an Si substrate, or a diamond substrate may be used as the substrate 101 of the semiconductor device 1 according to the first embodiment.

In the first embodiment, an example in which a Schottky barrier gate structure is employed is described. However, a MIS (Metal Insulator Semiconductor) type gate structure may be employed. In this case, ALD, sputter deposition, or plasma CVD may be used as a method of forming gate insulating film, but it is preferable that ALD is used. In addition, an oxide, a nitride, or an oxynitride of Si, Al, Hf, Zr, Ti, Ta, or W may be preferably used as material of the gate insulating film, and more preferably, $Al_2O_3$ may be used as material of the gate insulating film.

In the semiconductor device 1 according to the first embodiment, the spacer layer 104 is formed between the channel layer 103 and the barrier layer 105. However, forming the spacer layer 104 may be omitted in manufacturing the semiconductor device 1 according to the first embodiment. In this case, the nucleation layer 102, the channel layer 103, the barrier layer 105, the intermediate layer 106, and the cap layer 107 are sequentially formed on the substrate 101. Specifically, during a process illustrated in FIG. 8A, the nucleation layer 102 is formed on the substrate 101, and the channel layer 103 is formed on the nucleation layer 102. Subsequently, the barrier layer 105 is formed on the channel layer 103, the intermediate layer 106 is formed on the barrier layer 105, and the cap layer 107 is formed on the intermediate layer 106. When the semiconductor device 1 operates, 2DEG is generated in the channel layer 103, near an interface between the channel layer 103 and the barrier layer 105.

Second Embodiment

Figure 9:
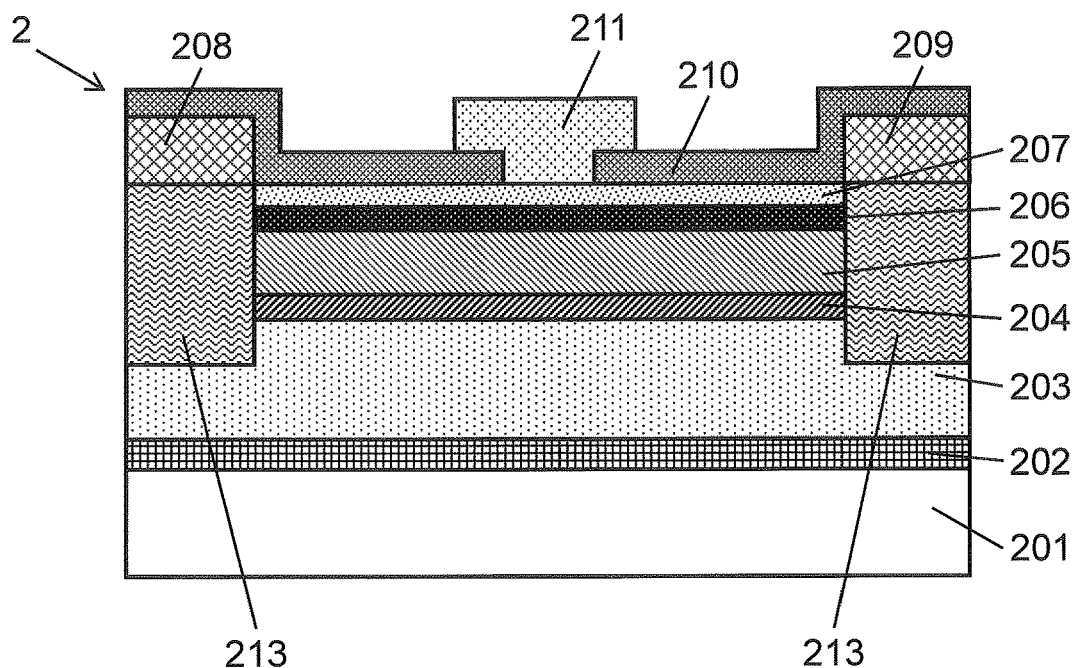
FIG. 9 is a cross-sectional view illustrating a structure of a semiconductor device according to a second embodiment.

Next, a second embodiment will be described. FIG. 9 is a cross-sectional view illustrating a structure of a semiconductor device 2 according to the second embodiment. The semiconductor device 2 according to the second embodiment is a semiconductor device of a HEMT structure. The semiconductor device 2 includes a substrate 201, a nucleation layer 202, a channel layer 203, a spacer layer 204, a barrier layer 205, an intermediate layer 206, and a cap layer 207. The substrate 201 is a semi-insulating SiC substrate, for example. The nucleation layer 202 includes AlN. The channel layer 203 includes GaN. The barrier layer 205 includes $In_{x1}Al_{y1}Ga_{1-x1-y1}N$ (0.00≤x1≤0.20, 0.60≤y1≤1.00). The intermediate layer 206 includes $In_{x2}Al_{y2}Ga_{1-x2-y2}N$ (0.00≤x2<0.04, 0.30≤y2≤0.60). Composition of the barrier layer 205 and the intermediate layer 206 may be the same. The spacer layer 204 includes $Al_{x3}Ga_{1-x3}N$ (0.30≤x3≤1.00). The cap layer 207 includes GaN. On the substrate 201, the nucleation layer 202, the channel layer 203, the spacer layer 204, the barrier layer 205, the intermediate layer 206, and the cap layer 207 are sequentially layered. By inserting the intermediate layer 206 containing $In_{x2}Al_{y2}Ga_{1-x2-y2}N$ (0.00≤x2<0.04, 0.30≤y2≤0.60) between the barrier layer 205 and the cap layer 207, incorporation of In and Al into the cap layer 207 is suppressed, and increase of sheet resistance in the semiconductor device 2 can be suppressed.

Because an In composition rate of the intermediate layer 206 is 0.04 or less, incorporation of In into the cap layer 207 can be suppressed. If incorporation of In into the cap layer 207 is suppressed, degradation of an electric characteristic of the semiconductor device 2 is avoided, and reliability of the semiconductor device 2 improves. Because an Al composition rate of the intermediate layer 206 is 0.60 or less, incorporation of Al into the cap layer 207 can be suppressed. If incorporation of Al into the cap layer 207 is suppressed, degradation of an electric characteristic of the semiconductor device 2 is avoided, and reliability of the semiconductor device 2 improves. Because an Al composition, rate of the intermediate layer 206 of the semiconductor device 2 is 0.30 or more, increase of sheet resistance of the semiconductor device 2 can be suppressed. Because an Al composition rate of the spacer layer 204 in the semiconductor device 2 is 0.30 or more, increase of sheet resistance of the semiconductor device 2 can be suppressed.

The semiconductor device 2 includes a source electrode 208, a drain electrode 209, passivation film 210, a gate electrode 211, and a contact layer 213. The contact layer 213 contains n-type GaN. The contact layer 213 penetrates through the cap layer 207, the intermediate layer 206, the barrier layer 205, and the spacer layer 204. Also, the contact layer 213 is in contact with the channel layer 203. In an example of the semiconductor device 2 illustrated in FIG. 9, a lower end of the contact layer 213 is inside the channel layer 203. The source electrode 208 and the drain electrode 209 are formed on the contact layer 213. That is, the semiconductor device 2 includes the contact layer 213 disposed just under the source electrode 208 and the drain electrode 209. By the contact layer 213 being disposed just under the source electrode 208 and the drain electrode 209, and by the contact layer 213 being in contact with the channel layer 203, contact resistance between the channel layer 203 and the source electrode 208 (and between the channel layer 203 and the drain electrode 209) is reduced. The gate electrode 211 is formed on the cap layer 207. The passivation film 210 covers a part of the cap layer 207, and also covers the source electrode 208 and the drain electrode 209. When the semiconductor device 2 operates, 2DEG is generated in the channel layer 203, near an interface between the channel layer 203 and the spacer layer 204.

Manufacturing Method of the Semiconductor Device

Figure 10A:
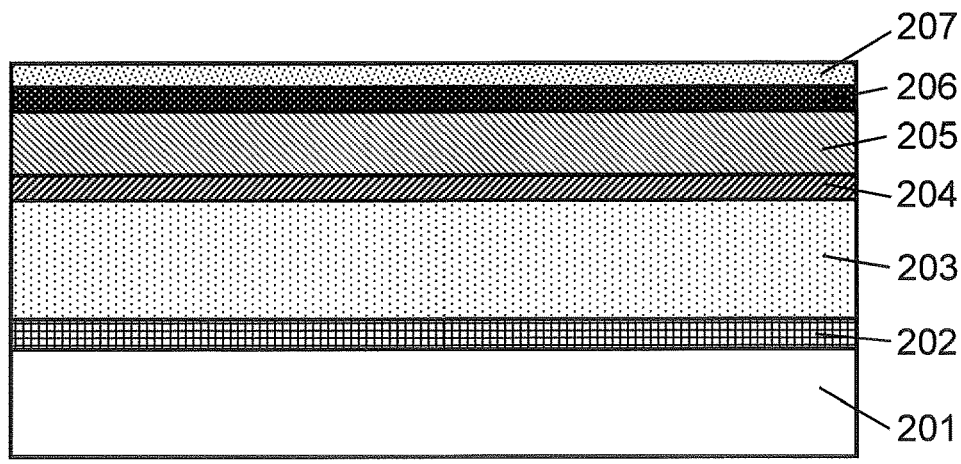
FIGS. 10A to 10G are cross-sectional views illustrating a manufacturing process of the semiconductor device according to the second embodiment.

A method of manufacturing the semiconductor device 2 according to the second embodiment will be described with reference to FIGS. 10A to 10G. FIGS. 10A to 10G are cross-sectional views illustrating a manufacturing process of the semiconductor device 2 according to the second embodiment. First, as illustrated in FIG. 10A, the substrate 201 is prepared. The substrate 201 is a semi-insulating SiC substrate. Next, as illustrated in FIG. 10A, the nucleation layer 202, the channel layer 203, the spacer layer 204, the barrier layer 205, the intermediate layer 206, and the cap layer 207 are sequentially layered on the substrate 201, by using MOVPE.

The nucleation layer 202 includes AlN. A thickness of the nucleation layer 202 is, for example, approximately 100 nm. The channel layer 203 includes GaN. A thickness of the channel layer 203 is, for example, approximately 3 μm. The spacer layer 204 includes $Al_{x3}Ga_{1-x3}N$ (0.30≤x3≤1.00). A thickness of the spacer layer 204 is, for example, approximately 2 nm. In a case in which a thickness of the spacer layer 204 is more than 2 nm and the semiconductor device 2 becomes thicker, high-frequency characteristics of the semiconductor device 2 may degrade. Further, in the case in which the thickness of the spacer layer 204 is more than 2 nm, distortion of the spacer layer 204 becomes large and cracks may be generated on the spacer layer 204. Thus, the thickness of the spacer layer 204 may preferably be not more than 2 nm.

The barrier layer 205 includes $In_{x1}Al_{y1}Ga_{1-x1-y1}N$ ($0.00 \leq x1 \leq 0.20$, $0.60 \leq y1 \leq 1.00$). A thickness of the barrier layer 205 is, for example, approximately 10 nm. The intermediate layer 206 includes $In_{x2}Al_{y2}Ga_{1-x2-y2}N$ ($0.00 \leq x2 < 0.04$, $0.30 \leq y2 \leq 0.60$). A thickness of the intermediate layer 206 is, for example, approximately 2 nm. The cap layer 207 includes GaN. A thickness of the cap layer 207 is, for example, approximately 2 nm. As described above with reference to FIG. 18, in a case in which a thickness of the cap layer 207 is more than 3 nm, high-frequency characteristics of the semiconductor device 2 may degrade. Thus, it is preferable that a thickness of the cap layer 207 is not more than 3 nm. If a thickness of the cap layer 207 is not more than 3 nm, incorporation of In and Al into the cap layer 207 can be suppressed and increase of sheet resistance of the semiconductor device 2 can be suppressed, without degrading high-frequency characteristics of the semiconductor device 2.

In order to grow GaN, as a source gas, mixed gas of trimethylgallium (TMGa) gas (which is a source of Ga) and ammonia ($NH_3$) gas is used. In order to grow AlN, as a source gas, mixed gas of trimethylaluminium (TMAl) gas (which is a source of Al) and $NH_3$ gas is used. In order to grow InAlGaN, as a source gas, mixed gas of trimethylindium (TMIn) gas, TMAl gas, TMGa gas, and $NH_3$ gas is used. In accordance with a type of a compound semiconductor to be grown, supplying status of TMIn gas, TMAl gas, and TMGa gas (such as necessity or a flow rate of these gases) may be appropriately controlled. Further, a growth pressure of each of the compound semiconductors is approximately 1 kPa to 100 kPa, and a growth temperature of each of the compound semiconductors is approximately 700° C. to 1200° C.

Figure 10B:
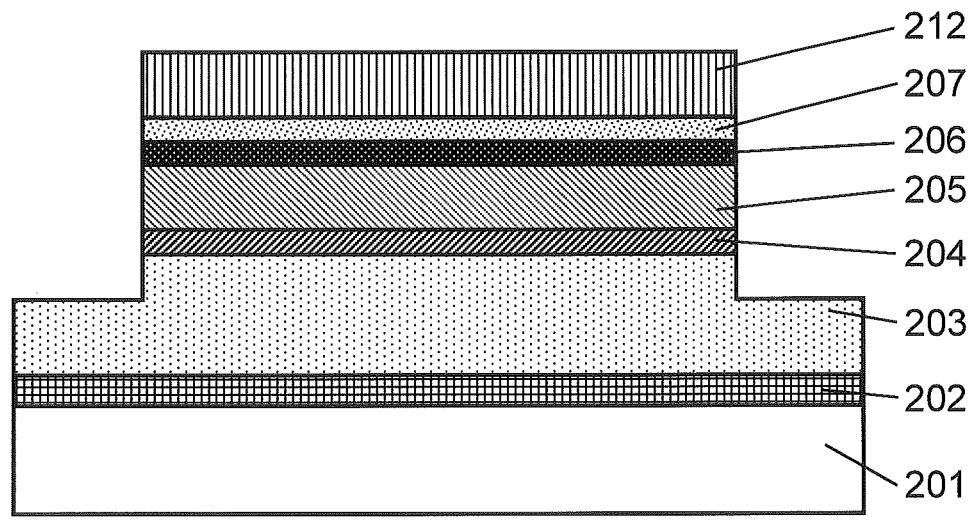

Next, by using the plasma-enhanced CVD method, surface protective film 212 is formed on the cap layer 207, as illustrated in FIG. 10B. The surface protective film 212 may be formed by either ALD or sputter deposition. Further, it is preferable that material for forming the surface protective film 212 is oxide, nitride, or oxynitride of Si, Al, Hf, Zr, Ti, Ta, or W. For example, $SiO_2$ is more preferable. Next, by using photolithography, a photoresist for source and drain electrodes is formed. The photoresist for source and drain electrodes includes openings at regions where the source electrode 208 and the drain electrode 209 are to be formed (in the present embodiment, the regions where the source electrode 208 and the drain electrode 209 are to be formed may also be referred to as "planned regions for source/drain electrodes"). Next, as illustrated in FIG. 10B, dry etching using chloride based gas is performed using the photoresist for source and drain electrodes as a mask, in order to remove parts of the surface protective film 212 deposited on locations corresponding to the planned regions for source/drain electrodes. The dry etching performed here also causes parts of the cap layer 207, the intermediate layer 206, the barrier layer 205, the spacer layer 204, and the channel layer 203, which are deposited on the locations corresponding to planned regions for the contact layer 213 (regions where the contact layer 213 is to be formed), to be removed. That is, part of the cap layer 207, part of the intermediate layer 206, part of the barrier layer 205, part of the spacer layer 204, and part of the channel layer 203, are removed. Note that an illustration of the photoresist for source and drain electrodes is omitted in FIG. 10B.

Figure 10C:
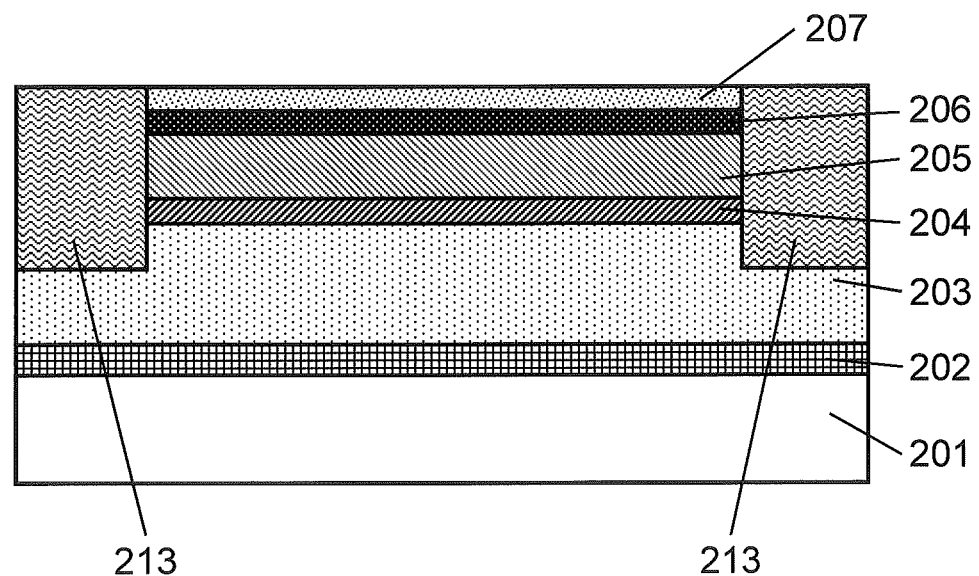

Next, as illustrated in FIG. 10C, the contact layer 213 is selectively formed on the planned regions for the contact layer 213, by using MOVPE. A thickness of the contact layer 213 is approximately 50 nm, for example. Next, as illustrated in FIG. 10C, the surface protective film 212 is removed. When growing GaN to be contained in the contact layer 213 as n-type GaN, an n-type dopant is added to a source gas of GaN. For example, in the present embodiment, by adding Si-containing gas such as silane ($SiH_4$) gas to the source gas at a predetermined flow rate, Si is doped with GaN. A concentration of the doped Si is approximately $1 \times 10^{19}$ cm$^{-3}$.

Next, by using photolithography, a photoresist for isolation, which includes an opening at a location where an isolation region is to be formed, is formed. Subsequently, dry etching using chlorine-based gas or ion implantation is performed using the photoresist for isolation as a mask, to form an isolation region (not illustrated).

Figure 10D:
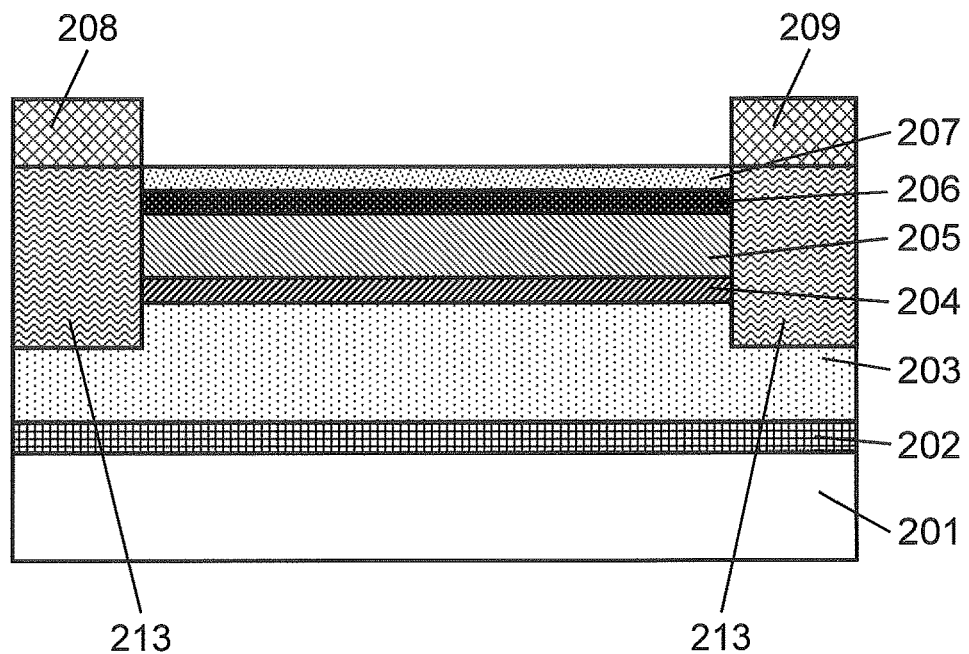

After the photoresist for isolation is removed, by using techniques of photolithography, vapor deposition, and liftoff, Ta and Al are sequentially formed on the planned regions for source/drain electrodes. A thickness of Ta is, for example, approximately 20 nm. A thickness of Al is, for example, approximately 200 nm. Subsequently, the substrate 201 is heat-treated in a nitrogen atmosphere at a temperature of approximately 400° C. to 1000° C., at 550° C. for example, to establish an ohmic characteristic. By forming Ta and Al as described in the above processes, the source electrode 208 and the drain electrode 209 are formed on the contact layer 213, as illustrated in FIG. 10D. The source electrode 208 and the drain electrode 209 are of layered structures, in which Al is disposed at an upper layer and Ta is disposed at a lower layer.

Figure 10E:
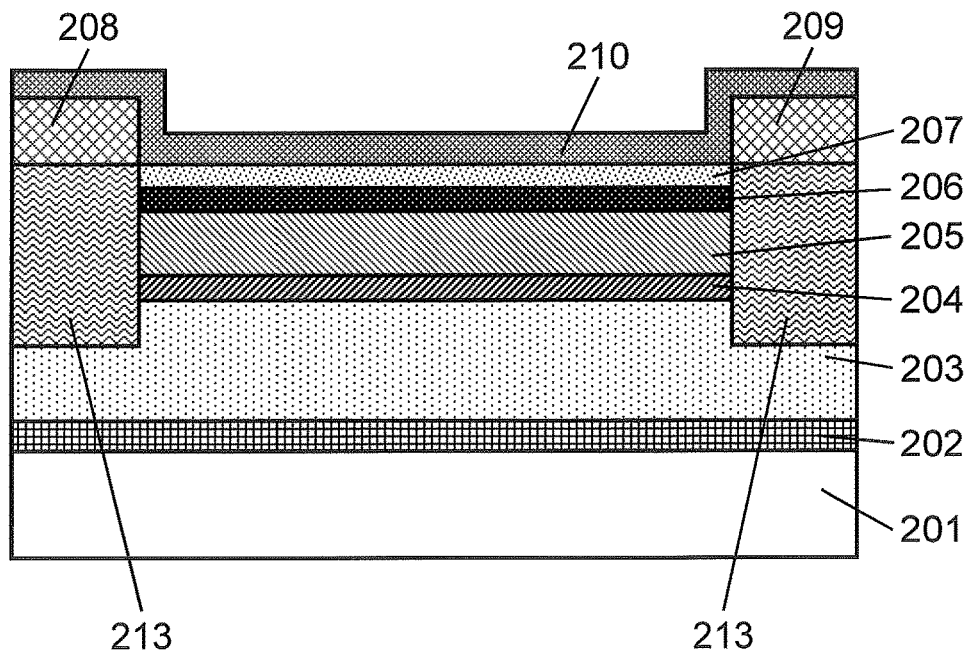

Next, by using plasma-enhanced CVD method, the passivation film 210 is formed so as to cover the cap layer 207, the source electrode 208, and the drain electrode 209, as illustrated in FIG. 10E. A thickness. of the passivation film 210 is approximately 2 nm to 500 nm, and approximately 100 nm for example. The passivation film 210 may be formed by either ALD or sputter deposition. Further, it is preferable that material for forming the passivation film 210 is oxide, nitride, or oxynitride of Si, Al, Hf, Zr, Ti, Ta, or W. For example, SiN is more preferable.

Figure 10F:
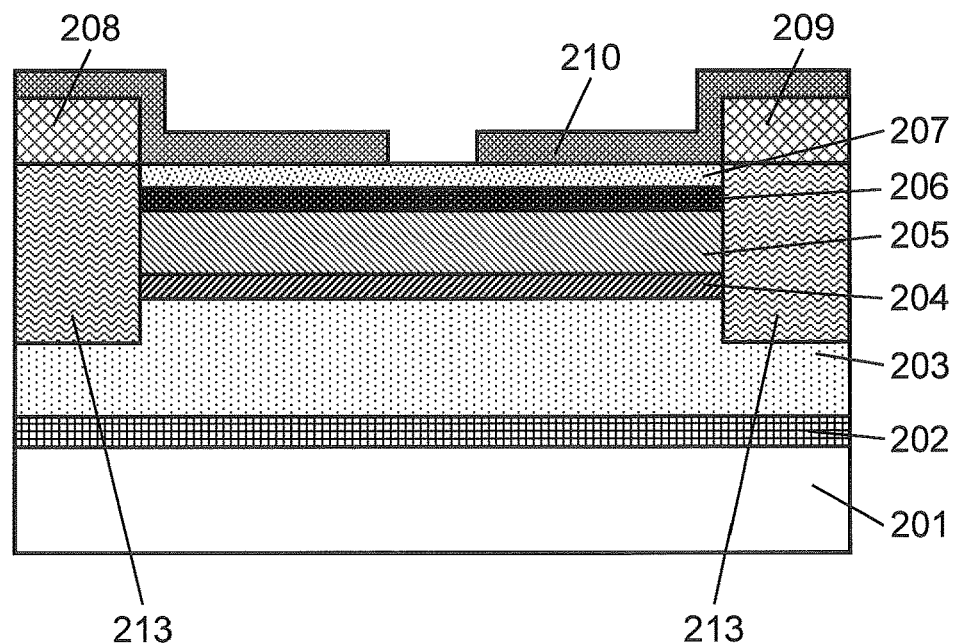

Next, by using photolithography, a photoresist for a gate electrode is formed. The photoresist for a gate electrode includes an opening at a location corresponding to a part of an area on which a gate electrode 211 is, to be formed (in the following, the area on which the gate electrode 211 is to be formed may also be referred to as a "planned area for gate electrode"). As illustrated in FIG. 10F, dry etching using fluorine-based gas or chlorine-based gas is performed using the photoresist for gate electrode as a mask, in order to remove a part of the passivation film 210 corresponding to the opening of the photoresist for gate electrode. Note that an illustration of the photoresist for gate electrode is omitted in FIG. 10F. Alternatively, the part of the passivation film 210 corresponding to the opening of the photoresist for gate electrode may be removed by wet etching using hydrofluoric acid or buffered hydrofluoric acid.

Figure 10G:
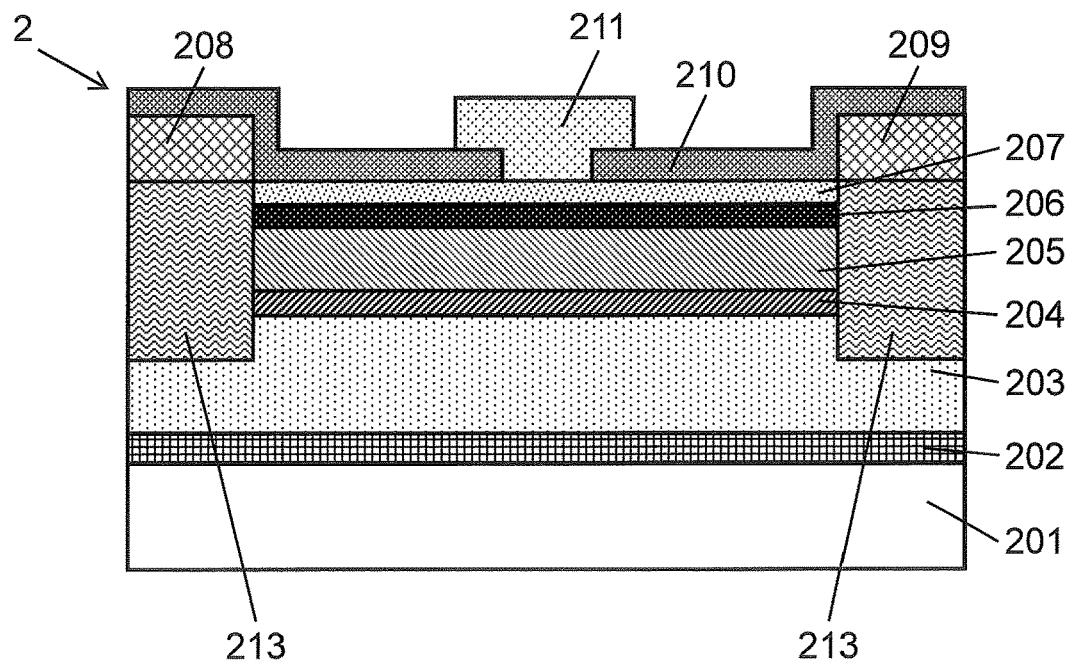

After the photoresist for gate electrode is removed, by using techniques of photolithography, vapor deposition, and liftoff, Ni and Au are sequentially formed on the planned area for gate electrode. A thickness of Ni is, for example, approximately 30 nm. A thickness of Au is, for example, approximately 400 nm. By forming Ni and Au as described above, the gate electrode 211 is formed on the cap layer 207, as illustrated in FIG. 10G. The gate electrode 211 is of a layered structure, in which Au is located at an upper layer and Ni is located at a lower layer. By performing the above processes, the semiconductor device 2 illustrated in FIG. 10G is manufactured.

The above mentioned layered structures of the source electrode 208, the drain electrode 209, and the gate electrode 211, in the semiconductor device 2 according to the second embodiment, are merely an example. That is, other types of structures (regardless of a single layered structure or a multi layered structure) may be employed in the source electrode 208, the drain electrode 209, and the gate electrode 211. Also, the above mentioned method of forming the source electrode 208, the drain electrode 209, and the gate electrode 211 are merely an example. That is, the source electrode 208, the drain electrode 209, and the gate electrode 211 may be formed by using other methods. In the manufacturing method of the semiconductor device 2 according to the second embodiment described above, heat treatment is performed when the source electrode 208 and the drain electrode 209 are formed. However, if an ohmic characteristic can be established without heat treatment, the heat treatment may be omitted. Further, heat treatment may further be applied to the gate electrode 211.

In the semiconductor device 2 according to the second embodiment, an SiC substrate of a semi-insulating substrate is used as the substrate 201. However, other material may be used as a substrate, if a nitride semiconductor is used in a part of an epitaxial structure having a function of a field effect transistor. Further, the substrate 201 may be a semi-insulating member or a conductive member. For example, a conductive SiC substrate, a sapphire substrate, a GaN substrate, an Si substrate, or a diamond substrate may be used as the substrate 201 of the semiconductor device 2 according to the second embodiment.

In the second embodiment, an example in which a Schottky barrier gate structure is employed is described. However, a MIS (Metal Insulator Semiconductor) type gate structure may be employed. In this case, ALD, sputter deposition, or plasma CVD may be used as a method of forming gate insulating film, but it is preferable that ALD is used. In addition, an oxide, a nitride, or an oxynitride of Si, Al, Hf, Zr, Ti, Ta, or W may preferably be used as material of the gate insulating film, and more preferably, $Al_2O_3$ may be used as material of the gate insulating film. Although, in the second embodiment, Si is used as an n-type dopant with which GaN contained in the contact layer 213 is doped, Ge, Sn, O, or the like may be used as an n-type dopant.

In the semiconductor device 2 according to the second embodiment, the spacer layer 204 is formed between the channel layer 203 and the barrier layer 205. However, forming the spacer layer 204 may be omitted in manufacturing the semiconductor device 2 according to the second embodiment. In this case, the nucleation layer 202, the channel layer 203, the barrier layer 205, the intermediate layer 206, and the cap layer 207 are sequentially formed on the substrate 201. Specifically, during a process illustrated in FIG. 10A, the nucleation layer 202 is formed on the substrate 201, and the channel layer 203 is formed on the nucleation layer 202. Subsequently, the barrier layer 205 is formed on the channel layer 203, the intermediate layer 206 is formed on the barrier layer 205, and the cap layer 207 is formed on the intermediate layer 206. During a process illustrated in FIG. 10B, part of the cap layer 207, part of the intermediate layer 206, part of the barrier layer 205, and part of the channel layer 203, are removed. During a process illustrated in FIG. 10C, the contact layer 213 is formed. By the above mentioned processes being performed, the contact layer 213, which is in contact with the channel layer 203 by penetrating through the cap layer 207, the intermediate layer 206, and the barrier layer 205, is formed. When the semiconductor device 2 operates, 2DEG is generated in the channel layer 203, near an interface between the channel layer 203 and the barrier layer 205.

Third Embodiment

Figure 11:
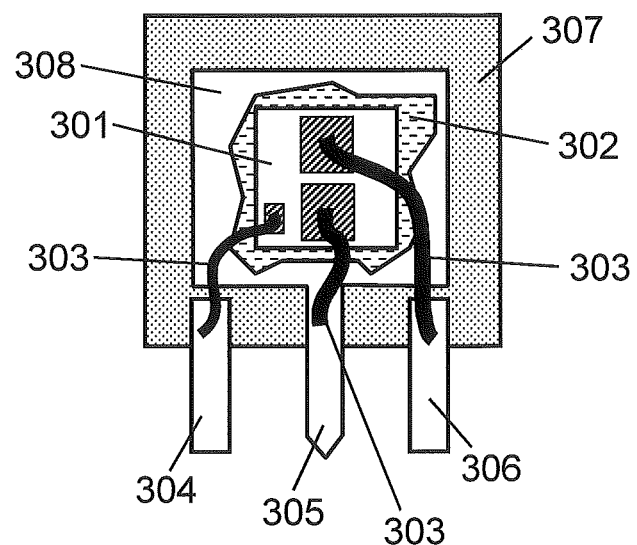
FIG. 11 is a diagram illustrating a discrete package according to a third embodiment.

Next, a third embodiment will be described with reference to FIG. 11. The third embodiment relates to a discrete package including a GaN-based HEMT. FIG. 11 is a plan view illustrating a discrete package according to the third embodiment. A method of manufacturing the discrete package including the GaN-based HEMT illustrated in FIG. 11 will be described in the following. First, a GaN-based HEMT chip 301 is fixed on a lead frame 308 using a die attaching agent 302 such as solder. Next, a gate electrode is connected to a gate lead 304 with a bonding wire formed of an Al wire 303, a drain electrode is connected to a drain lead 305 with a bonding wire formed of an Al wire 303, and a source electrode is connected to a source lead 306 with a bonding wire formed of an Al wire 303. Next, by transfer molding, sealing with molding resin 307 is performed. Subsequently, the lead frame 308 is separated. By performing the process described here, the discrete package including the GaN-based HEMT as illustrated in FIG. 11 is manufactured.

Fourth Embodiment

Figure 12:
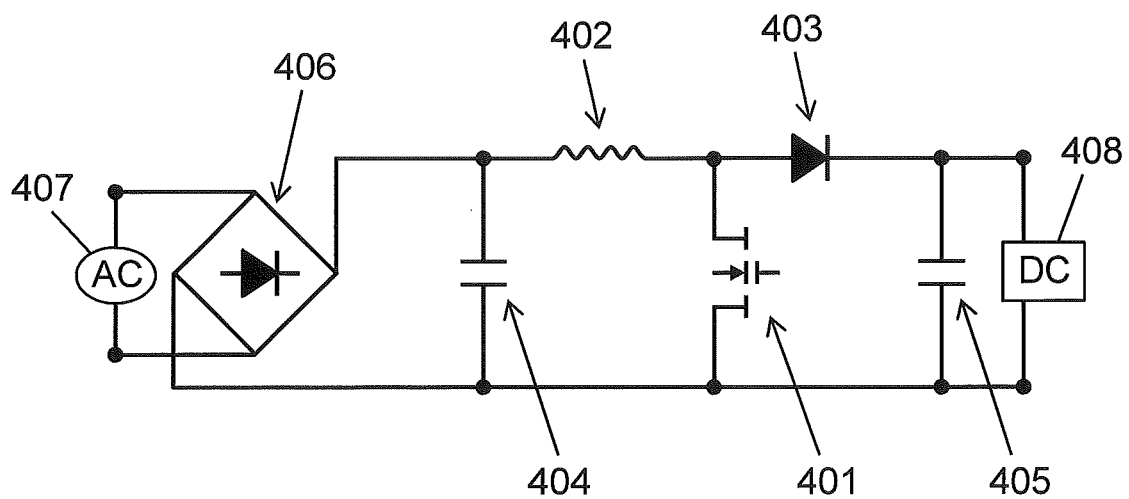
FIG. 12 illustrates a circuit diagram of a PFC circuit according to a fourth embodiment.

Next, a fourth embodiment will be described with reference to FIG. 12. The fourth embodiment relates to a server equipped with a power supply device including a GaN-based HEMT (server power unit). FIG. 12 is a diagram illustrating a PFC (Power Factor Correction) circuit according to the fourth embodiment. The PFC circuit includes a GaN-based HEMT 401 disposed on a PFC circuit board, a choke coil 402, a diode 403, capacitors 404 and 405, and a diode bridge 406. As the GaN-based HEMT 401, the semiconductor device 1 according to the first embodiment or the semiconductor device 2 according to the second embodiment may be used.

A terminal of the choke coil 402 and an anode terminal of the diode 403 are connected to a drain electrode of the GaN-based HEMT 401. To the other terminal of the choke coil 402, a terminal of the capacitor 404 is connected. A terminal of the capacitor 405 is connected to a cathode terminal of the diode 403. A source electrode of the GaN-based HEMT 401, the other terminal of the capacitor 404, and the other terminal of the capacitor 405 are grounded. Between the terminals of the capacitor 404, an alternate current (AC) power source 407 is connected via the diode bridge 406. Between the terminals of the capacitor 405, a direct current (DC) power source 408 is connected. A gate driver is connected to a gate electrode of the GaN-based HEMT 401. In manufacturing the PFC circuit, the drain electrode of the GaN-based HEMT 401, one of the terminals of the choke coil 402, and the anode terminal of the diode 403 are connected to each other, by using solder for example. Further, in manufacturing the PFC circuit, the source electrode of the GaN-based HEMT 401 is connected to a wire for grounding, by using solder for example. Further, in manufacturing the PFC circuit, the gate electrode of the GaN-based HEMT 401 is connected to the gate driver, by using solder for example. Accordingly, the PFC circuit using the GaN-based HEMT can be manufactured, as illustrated in FIG. 12. The PFC circuit illustrated in FIG. 12 may be embedded and used in a power supply device of a server or other power supply devices. By embedding the PFC circuit illustrated in FIG. 12 in a power supply device of a server or other power supply devices, a highly reliable power supply device can be configured.

Fifth Embodiment

Figure 13:
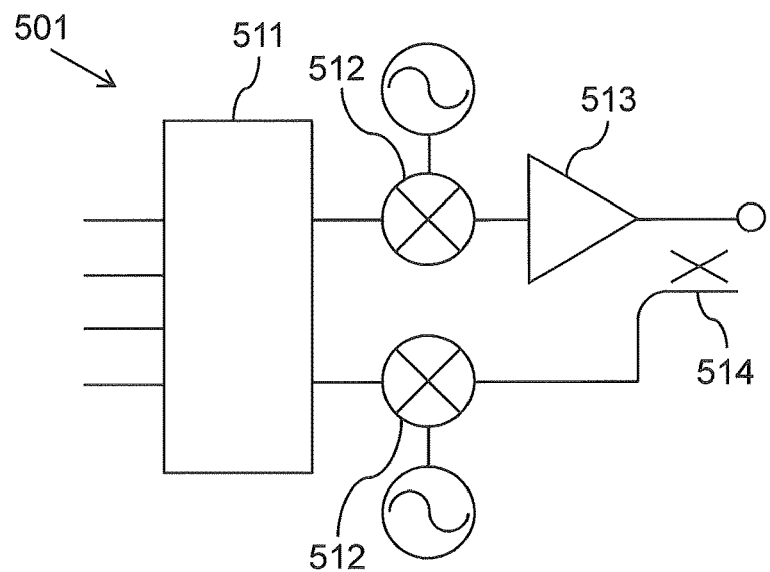
FIG. 13 is a diagram illustrating a structure of a high-power amplifier.
Figure 14:
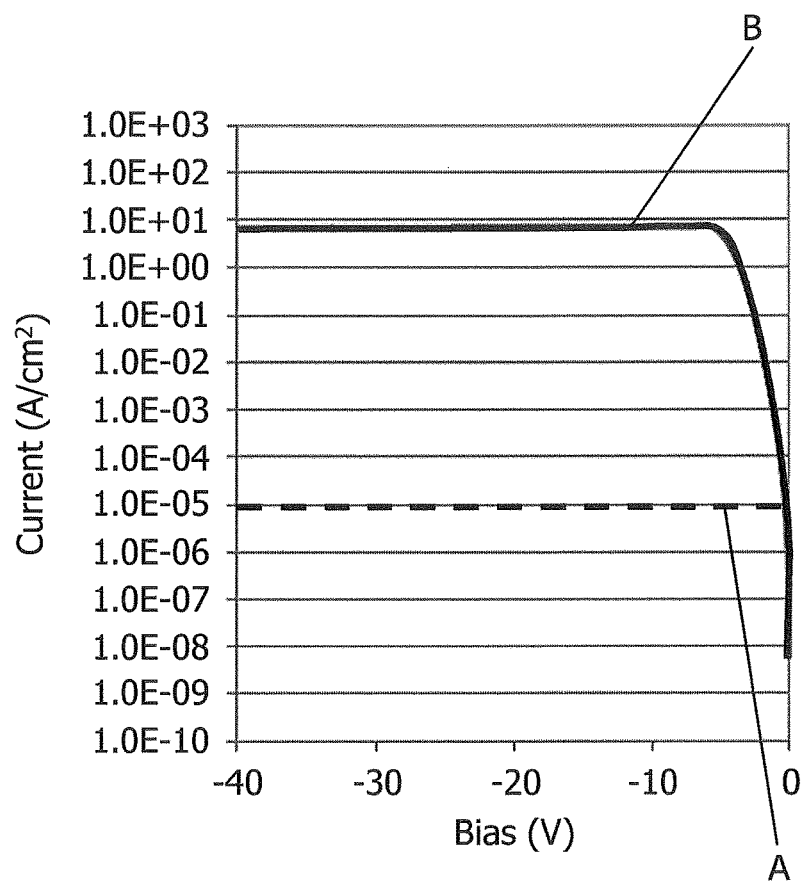
FIG. 14 is a graph illustrating a gate leakage current of an AlGaN-HEMT and a gate leakage current of an InAlN-HEMT.
Figure 15:
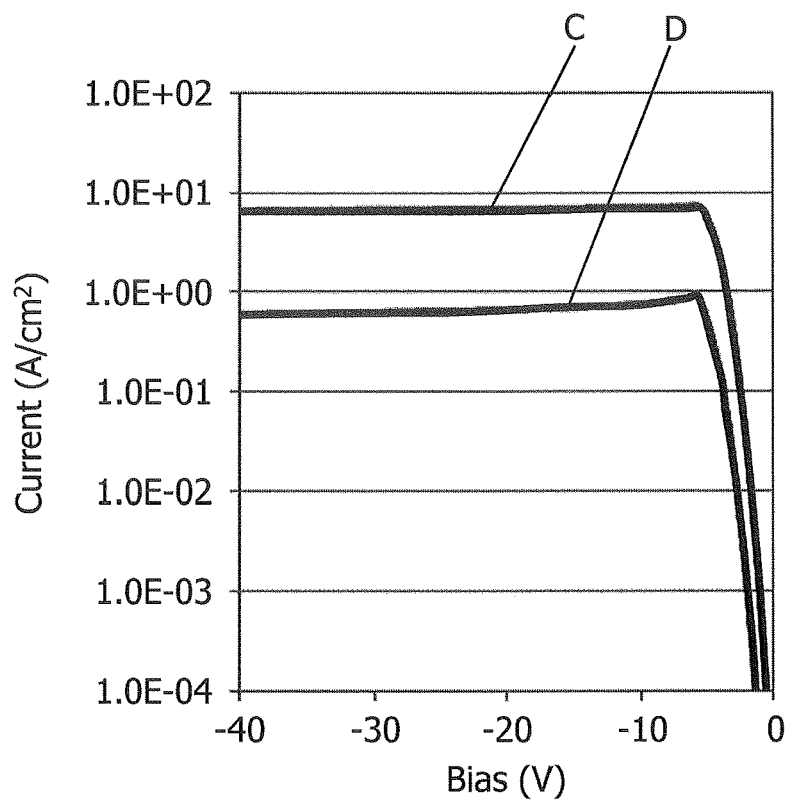
FIG. 15 is a graph illustrating gate leakage characteristics of InAlN-HEMTs.
Figure 16:
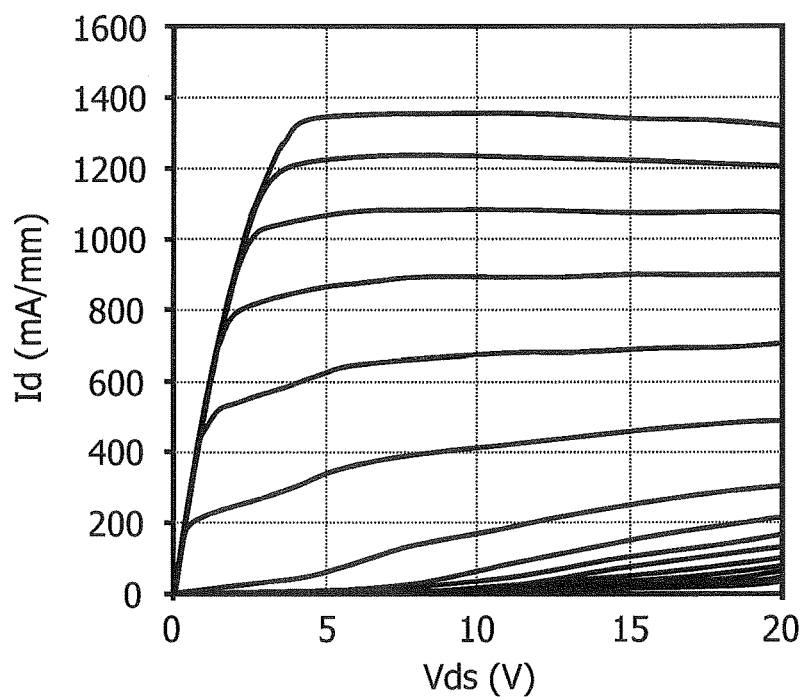
FIG. 16 is a graph illustrating current-voltage characteristics of an InAlN-HEMT.
Figure 17:
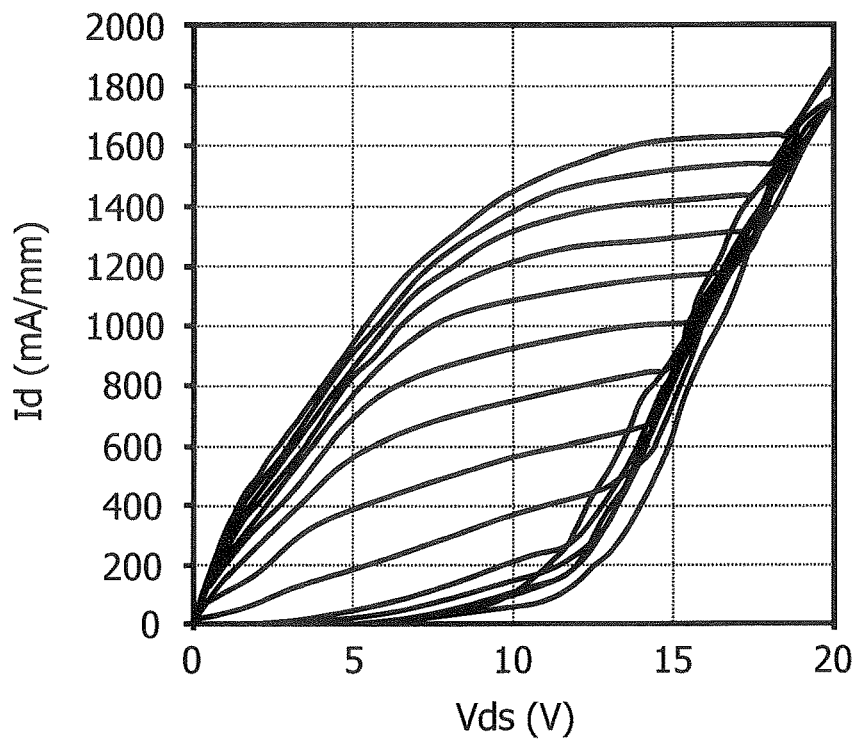
FIG. 17 is a graph illustrating current-voltage characteristics of an InAlN-HEMT.

Next, a fifth embodiment will be described with reference to FIG. 13. The fifth embodiment relates to a high-power amplifier (high-frequency amplifier). FIG. 13 is a diagram of the high-power amplifier 501. The high-power amplifier 501 may be used for a power amplifier for a base station for a cellular phone. The high-power amplifier 501 includes a digital predistortion circuit 511, mixers 512, a power amplifier 513, and a directional coupler 514. The digital predistortion circuit 511 compensates for non-linear distortion with respect to an input signal. The mixer 512 mixes the input signal of which the non-linear distortion was compensated with an AC signal. The power amplifier 513 amplifies the input signal mixed with the AC signal. In the example illustrated in FIG. 13, the power amplifier 513 may include the semiconductor device 1 according to the first embodiment or the semiconductor device 2 according to the second embodiment. The directional coupler 514 is used for monitoring the input signal or an output signal. The high-power amplifier 501 illustrated in FIG. 13 can, in accordance with the switching operation by users for example, mix an output-side signal with an AC signal using the mixer 512, and can send the mixed signal to the digital predistortion circuit 511.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
   a channel layer formed above a substrate, the channel layer containing GaN;
   a barrier layer formed above the channel layer, the barrier layer containing $In_{x1}Al_{y1}Ga_{1-x1-y1}N$ ($0.00 \leq x1 \leq 0.20$, $0.60 \leq y1 \leq 1.00$);
   a spacer layer containing $Al_{x3}Ga_{1-x3}N$ ($0.30 \leq x3 \leq 1.00$) between the channel layer and the barrier layer;
   an intermediate layer formed on the barrier layer, the intermediate layer containing $In_{x2}Al_{y2}Ga_{1-x2-y2}N$ ($0.00 \leq x2 < 0.04$, $0.30 \leq y2 \leq 0.60$);
   a cap layer formed on the intermediate layer, the cap layer containing GaN and having a thickness of not more than 3 nm; and
   a gate electrode formed on the cap layer.

2. The semiconductor device according to claim 1, further comprising
   a contact layer containing n-type GaN;
   a source electrode formed on the contact layer; and
   a drain electrode formed on the contact layer, wherein
   the contact layer is in contact with the channel layer by penetrating through the cap layer, the intermediate layer, and the barrier layer.

3. The semiconductor device according to claim 1, wherein a thickness of the spacer layer is not more than 2 nm.

4. The semiconductor device according to claim 1, further comprising
   a contact layer containing n-type GaN;
   a source electrode formed on the contact layer; and
   a drain electrode formed on the contact layer, wherein
   the contact layer is in contact with the channel layer by penetrating through the cap layer, the intermediate layer, the barrier layer, and the spacer layer.

5. The semiconductor device according to claim 1, wherein composition of the barrier layer and composition of the intermediate layer are same.

6. A method of manufacturing a semiconductor device comprising:
   forming, above a substrate, a channel layer containing GaN;
   forming, on the channel layer, a spacer layer containing $Al_{x3}Ga_{1-x3}N$ ($0.30 \leq x3 \leq 1.00$);
   forming, on the spacer layer, a barrier layer containing $In_{x1}Al_{y1}Ga_{1-x1-y1}N$ ($0.00 \leq x1 \leq 0.20$, $0.60 \leq y1 \leq 1.00$);
   forming, on the barrier layer, an intermediate layer containing $In_{x2}Al_{y2}Ga_{1-x2-y2}N$ ($0.00 \leq x2 < 0.04$, $0.30 \leq y2 \leq 0.60$);
   forming, on the intermediate layer, a cap layer containing GaN and having a thickness of not more than 3 nm; and
   forming a gate electrode on the cap layer.

7. The method according to claim 6, further comprising
   removing, after the forming of the cap layer, a part of the cap layer, a part of the intermediate layer, a part of the barrier layer, and a part of the channel layer;
   forming a contact layer containing n-type GaN, such that the contact layer is in contact with the channel layer by penetrating through the cap layer, the intermediate layer, and the barrier layer; and
   forming a source electrode and a drain electrode on the contact layer.

8. The method according to claim 6, wherein a thickness of the spacer layer is not more than 2 nm.

9. The method according to claim 6, further comprising
   removing, after the forming of the cap layer, a part of the cap layer, a part of the intermediate layer, a part of the barrier layer, a part of the spacer layer, and a part of the channel layer;
   forming a contact layer containing n-type GaN, such that the contact layer is in contact with the channel layer by penetrating through the cap layer, the intermediate layer, the barrier layer, and the spacer layer; and
   forming a source electrode and a drain electrode on the contact layer.

10. The method according to claim 6, wherein a thickness of the cap layer is not more than 3 nm.

11. The method according to claim 6, wherein composition of the barrier layer and composition of the intermediate layer are same.

* * * * *